United States Patent
Ishizu et al.

(10) Patent No.: US 12,417,906 B2
(45) Date of Patent: Sep. 16, 2025

(54) SUBSTRATE PROCESSING METHOD AND SUBSTRATE PROCESSING APPARATUS

(71) Applicant: SCREEN Holdings Co., Ltd., Kyoto (JP)

(72) Inventors: Takaaki Ishizu, Kyoto (JP); Yuta Nakano, Kyoto (JP)

(73) Assignee: SCREEN HOLDINGS CO., LTD. (JP)

( * ) Notice: Subject to any disclaimer, the term of this patent is extended or adjusted under 35 U.S.C. 154(b) by 336 days.

(21) Appl. No.: 17/742,672

(22) Filed: May 12, 2022

(65) Prior Publication Data

US 2022/0375743 A1 Nov. 24, 2022

(30) Foreign Application Priority Data

May 20, 2021 (JP) .................. 2021-085294

(51) Int. Cl.
 *H01L 21/02* (2006.01)
 *H01L 21/67* (2006.01)
(52) U.S. Cl.
 CPC .. *H01L 21/02019* (2013.01); *H01L 21/67028* (2013.01); *H01L 21/6708* (2013.01)
(58) Field of Classification Search
 None
 See application file for complete search history.

(56) References Cited

U.S. PATENT DOCUMENTS

| 6,578,589 | B1* | 6/2003 | Mayusumi | H01L 21/67115 |
| | | | | 134/61 |
| 2006/0183240 | A1 | 8/2006 | Taniyama | 436/151 |
| 2008/0066337 | A1* | 3/2008 | Seki | C11D 7/28 |
| | | | | 34/329 |
| 2008/0230101 | A1 | 9/2008 | Hayashi | 134/57 R |
| 2010/0206337 | A1 | 8/2010 | Hiroshiro et al. | |

(Continued)

FOREIGN PATENT DOCUMENTS

| JP | 2011060955 A | * | 3/2011 |
| JP | 2013-157625 A | | 8/2013 |

(Continued)

OTHER PUBLICATIONS

Machine translation: JP2011060955, Sato et al. (Year: 2011).*

(Continued)

*Primary Examiner* — Natasha N Campbell
(74) *Attorney, Agent, or Firm* — OSTROLENK FABER LLP

(57) ABSTRACT

A substrate processing method includes a step of supplying a dry processing liquid onto the upper surface of the substrate, to thereby form a liquid film of the dry processing liquid on the upper surface of the substrate (Step S14), a step of heating the substrate from the side of a lower surface thereof in a state where the liquid film of the dry processing liquid is formed on the upper surface thereof (Step S15), and a step of drying the substrate (Step S16). The surface tension of the dry processing liquid is lower than that of the rinse liquid. The boiling point of the dry processing liquid is higher than that of the rinse liquid. The heating temperature of the substrate in Step S15 is not lower than the boiling point of the rinse liquid and lower than that of the dry processing liquid.

13 Claims, 7 Drawing Sheets

(56) References Cited

U.S. PATENT DOCUMENTS

| | | | |
|---|---|---|---|
| 2012/0045581 A1 | 2/2012 | Kimura et al. | 427/248.1 |
| 2014/0127908 A1 | 5/2014 | Okutani | 438/694 |
| 2017/0186599 A1 | 6/2017 | Takahashi et al. | 438/704 |
| 2018/0204743 A1* | 7/2018 | Otsuji | H01L 21/67023 |
| 2019/0088469 A1 | 3/2019 | Tanaka et al. | |

FOREIGN PATENT DOCUMENTS

| | | |
|---|---|---|
| JP | 2014-112652 A | 6/2014 |
| JP | 2017-117954 A | 6/2017 |
| KR | 10-2008-0086814 A | 9/2008 |
| KR | 10-2011-0131707 A | 12/2011 |
| TW | 200908105 A | 3/1997 |
| TW | 201916219 A | 4/2019 |
| TW | 202011501 A | 3/2020 |
| TW | 202030836 A | 8/2020 |
| TW | 202102314 A | 1/2021 |
| WO | WO 2020/039784 A1 | 2/2020 |
| WO | WO 2020/116164 A1 | 6/2020 |
| WO | WO 2020/213481 A1 | 10/2020 |

OTHER PUBLICATIONS

Office Action dated Jan. 15, 2024 for the corresponding Korean Patent Application No. 10-2022-0059451 with English translation.

Office Action issued on Feb. 18, 2023 for corresponding Taiwanese Patent Application No. 111118302.

Zhu Fusheng et al., "Application of Wafer Drying Technology in High Cleanliness Wet Cleaning Equipment", Equipment for Electronic Products Manufacturing, 280 (Feb. 2020). Includes English Title and Abstract.

Chinese Office Action, dated Jul. 31, 2025, issued in corresponding Chinese Patent Application No. 202210547052.5. Includes English translation.

* cited by examiner

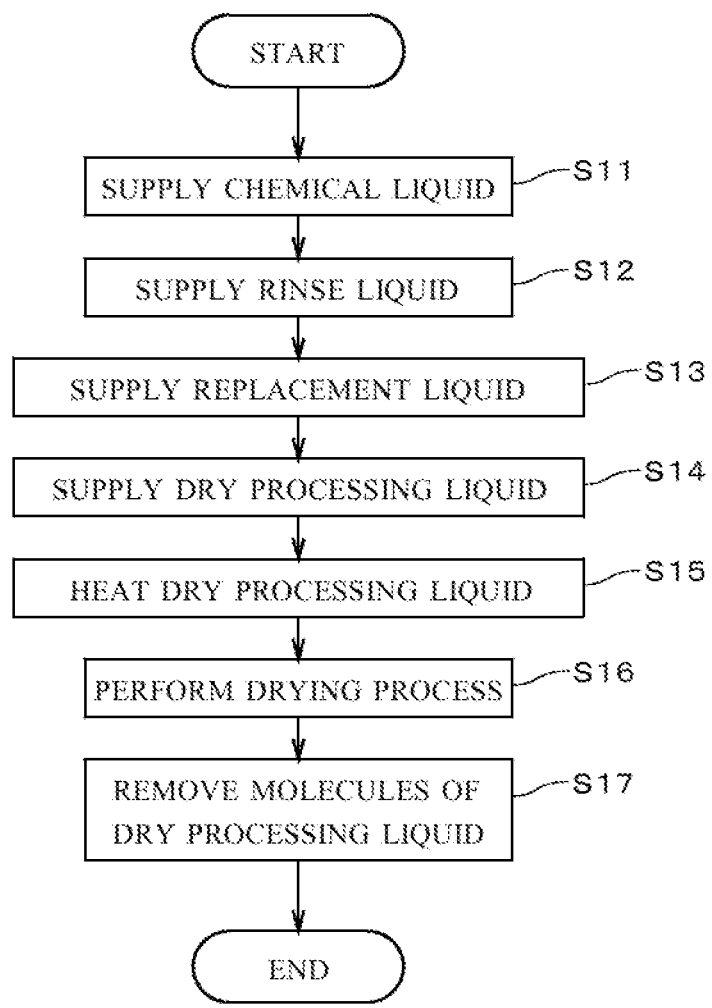

SUBSTRATE PROCESSING METHOD AND SUBSTRATE PROCESSING APPARATUS

CROSS REFERENCE TO RELATED APPLICATION

The present application claims the benefit of priority to Japanese Patent Application No. 2021-085294 filed on May 20, 2021, the content of which is incorporated herein by reference in its entirety.

TECHNICAL FIELD

The present invention relates to a technique for processing a substrate.

BACKGROUND ART

In a process of manufacturing a semiconductor substrate (hereinafter, referred to simply as a "substrate"), conventionally, various processings are performed on the substrate. For example, a chemical liquid such as an etching solution or the like is supplied onto a surface of the substrate held in a horizontal state and a chemical liquid process is thereby performed. Further, after the chemical liquid process is finished, a rinse liquid is supplied onto the substrate and a rinsing process is thereby performed, and then the substrate is rotated and a drying process is thereby performed.

In a case where fine patterns are formed on the surface of the substrate, at a contact position between a liquid surface formed between the patterns (i.e., an interface between the liquid and the air) and the pattern, surface tension of the liquid is exerted. Since the surface tension of water which is typically used as the above-described rinse liquid is high, there is a possibility that the patterns may be collapsed during the drying process after the rinsing process.

Then, Japanese Patent Application Laid-Open No. 2017-117954 (Document 1) discloses a technique in which in order to suppress collapse of the patterns, IPA (isopropyl alcohol) having surface tension and a boiling point both lower than those of water is supplied onto the substrate after the rinsing process, to thereby replace the water, and then removed from the substrate, and the drying process is performed on the substrate. In Document 1, as the liquid that can be used instead of IPA, disclosed are HFE (hydrofluoroether), methanol, ethanol, and the like, each of which has surface tension and a boiling point both lower than those of water.

Further, Japanese Patent Application Laid-Open No. 2013-157625 (Document 2) discloses a technique in which in order to suppress collapse of the patterns, IPA is supplied onto the substrate after the rinsing process, to thereby replace the water, and a hydrophobizing agent is supplied onto the substrate, to thereby hydrophobize an upper surface of the substrate, and IPA is further supplied onto the substrate, to thereby replace the hydrophobizing agent, and then removed from the substrate, and the drying process is performed on the substrate. In Document 2, as the liquid that can be used instead of IPA, disclosed are HFE, HFC (hydrofluorocarbon), methanol, ethanol, and the like, each of which has surface tension and a boiling point both lower than those of water.

In recent years, as the aspect ratio of the pattern on the substrate becomes higher, the pattern becomes easier to collapse and it is required to further suppress the collapse of the pattern during the drying process.

SUMMARY OF INVENTION

The present invention is intended for a substrate processing method for processing a substrate having an upper surface on which a pattern including a recessed portion is formed, and it is an object of the present invention to suppress collapse of the pattern during a drying process.

The substrate processing method according to one preferred embodiment of the present invention includes a) supplying a chemical liquid onto an upper surface of a substrate, b) supplying a rinse liquid onto the upper surface of the substrate after the operation a), c) supplying a dry processing liquid onto the upper surface of the substrate, to thereby form a liquid film of the dry processing liquid on the upper surface of the substrate after the operation b), d) heating the substrate from the side of a lower surface thereof in a state where the liquid film of the dry processing liquid is formed on the upper surface thereof, and e) drying the substrate by removing the liquid film of the dry processing liquid from the upper surface of the substrate after the operation d). The surface tension of the dry processing liquid is lower than that of the rinse liquid. The boiling point of the dry processing liquid is higher than that of the rinse liquid. The heating temperature of the substrate in the operation d) is not lower than the boiling point of the rinse liquid and lower than that of the dry processing liquid.

According to the substrate processing method, it is possible to suppress collapse of a pattern during a drying process.

Preferably, the substrate processing method further includes removing molecules of the dry processing liquid adsorbed on the upper surface of the substrate by heating the substrate after the operation e).

Preferably, the substrate processing method further includes supplying a replacement liquid onto the upper surface of the substrate, to thereby replace the rinse liquid on the upper surface of the substrate with the replacement liquid between the operation b) and the operation c). In the operation c), the replacement liquid on the upper surface of the substrate is replaced with the dry processing liquid.

Preferably, in the operation c), the dry processing liquid which is preheated is supplied onto the upper surface of the substrate.

Preferably, also during execution of the operation e), the substrate is heated from the side of the lower surface thereof.

Preferably, heating of the substrate in the operation d) is performed by an electric heater which is so disposed as to face the lower surface of the substrate.

Preferably, the dry processing liquid contains fluorine-containing alcohol.

The present invention is also intended for a substrate processing apparatus for processing a substrate having an upper surface on which a pattern including a recessed portion is formed. The substrate processing apparatus according to one preferred embodiment of the present invention includes a chemical liquid supply part supplying a chemical liquid onto an upper surface of a substrate, a rinse liquid supply part supplying a rinse liquid onto the upper surface of the substrate, a dry processing liquid supply part supplying a dry processing liquid onto the upper surface of the substrate, a substrate heater heating the substrate from the side of a lower surface thereof in a state where a liquid film of the dry processing liquid is formed on the upper surface thereof, and a dry processing part drying the substrate by removing the liquid film of the dry processing liquid from the upper surface of the substrate. The surface tension of the dry processing liquid is lower than that of the rinse liquid. The boiling point of the dry processing liquid is higher than that of the rinse liquid. The temperature of heating of the substrate performed by the substrate heater is not lower than the boiling point of the rinse liquid and lower than that of the dry processing liquid.

Preferably, the substrate heater is an electric heater which is so disposed as to face the lower surface of the substrate.

Preferably, the dry processing liquid contains fluorine-containing alcohol.

These and other objects, features, aspects and advantages of the present invention will become more apparent from the following detailed description of the present invention when taken in conjunction with the accompanying drawings.

BRIEF DESCRIPTION OF DRAWINGS

FIG. 5 is a flowchart showing an operation flow for processing a substrate;

DESCRIPTION OF EMBODIMENTS

Figure 1:
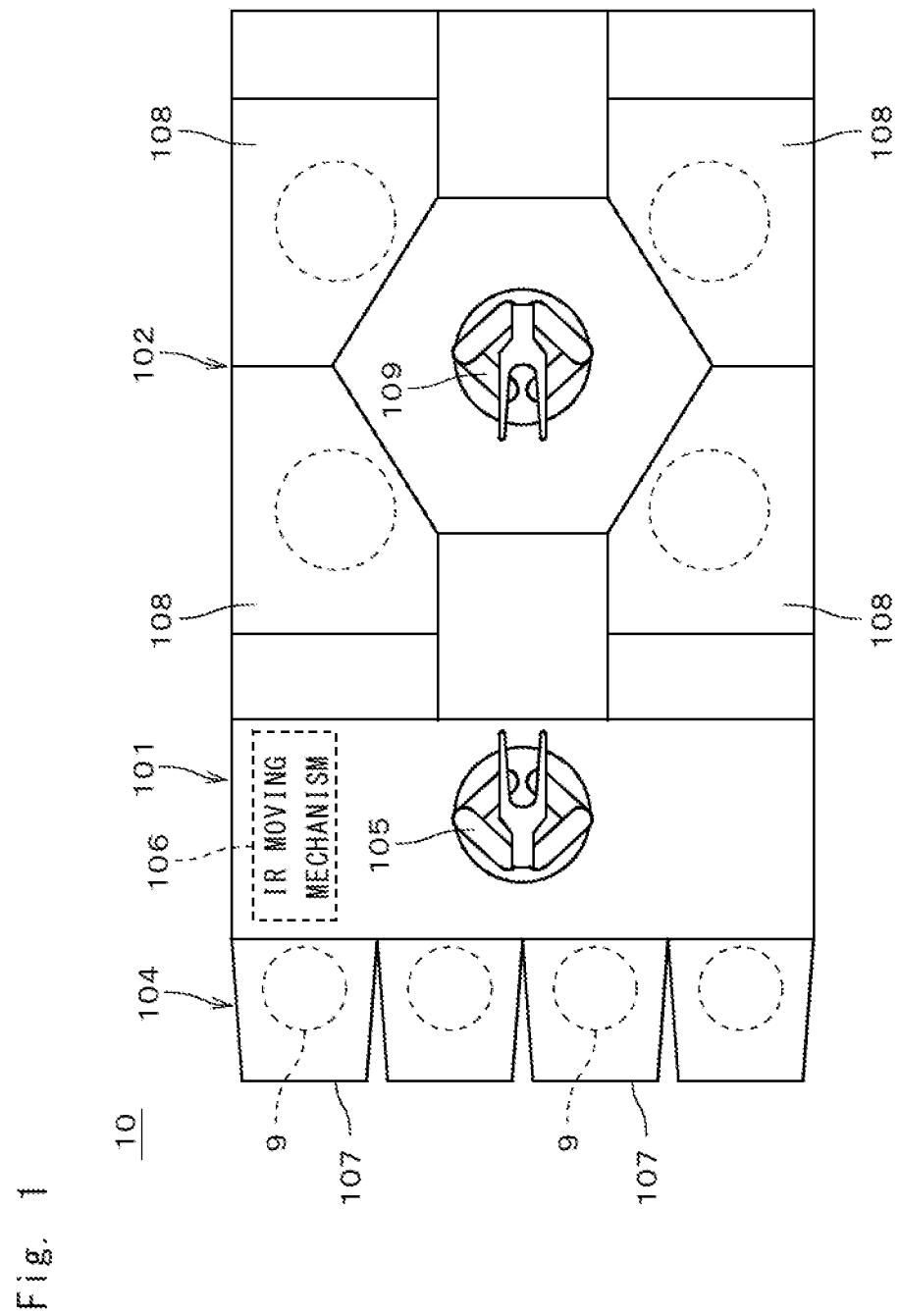
FIG. 1 is a plan view showing a substrate processing system in accordance with one preferred embodiment.

FIG. 1 is a plan view schematically showing a layout of a substrate processing system 10 including a substrate processing apparatus in accordance with one preferred embodiment of the present invention. The substrate processing system 10 is a system for processing a semiconductor substrate 9 (hereinafter, referred to simply as a "substrate 9"). The substrate processing system 10 includes an indexer block 101 and a processing block 102 coupled with the indexer block 101.

The indexer block 101 includes a carrier holding part 104, an indexer robot 105 (i.e., a substrate transfer means), and an IR moving mechanism 106. The carrier holding part 104 holds a plurality of carriers 107 which can accommodate a plurality of substrates 9. The plurality of carriers 107 (e.g., FOUPs) are held by the carrier holding part 104 while being arranged in a horizontal carrier arrangement direction (i.e., an up-and-down direction in FIG. 1). The IR moving mechanism 106 moves the indexer robot 105 in the carrier arrangement direction. The indexer robot 105 performs an unloading operation for unloading the substrate 9 from the carrier 107 and a loading operation for loading the substrate 9 into the carrier 107 held by the carrier holding part 104. The substrate 9 is transferred in a horizontal state by the indexer robot 105.

On the other hand, the processing block 102 includes a plurality of (e.g., four or more) processing units 108 for processing the substrate 9 and a center robot 109 (i.e., a substrate transfer means). The plurality of processing units 108 are so disposed as to surround the center robot 109 in a plan view. In the plurality of processing units 108, various processings are performed on the substrate 9. The substrate processing apparatus described later is one of the plurality of processing units 108. The center robot 109 performs a loading operation for loading the substrate 9 into the processing unit 108 and an unloading operation for unloading the substrate 9 from the processing unit 108. Further, the center robot 109 transfers the substrate 9 among the plurality of processing units 108. The substrate 9 is transferred in a horizontal state by the center robot 109. The center robot 109 receives the substrate 9 from the indexer robot 105 and passes the substrate 9 to the indexer robot 105.

Figure 2:
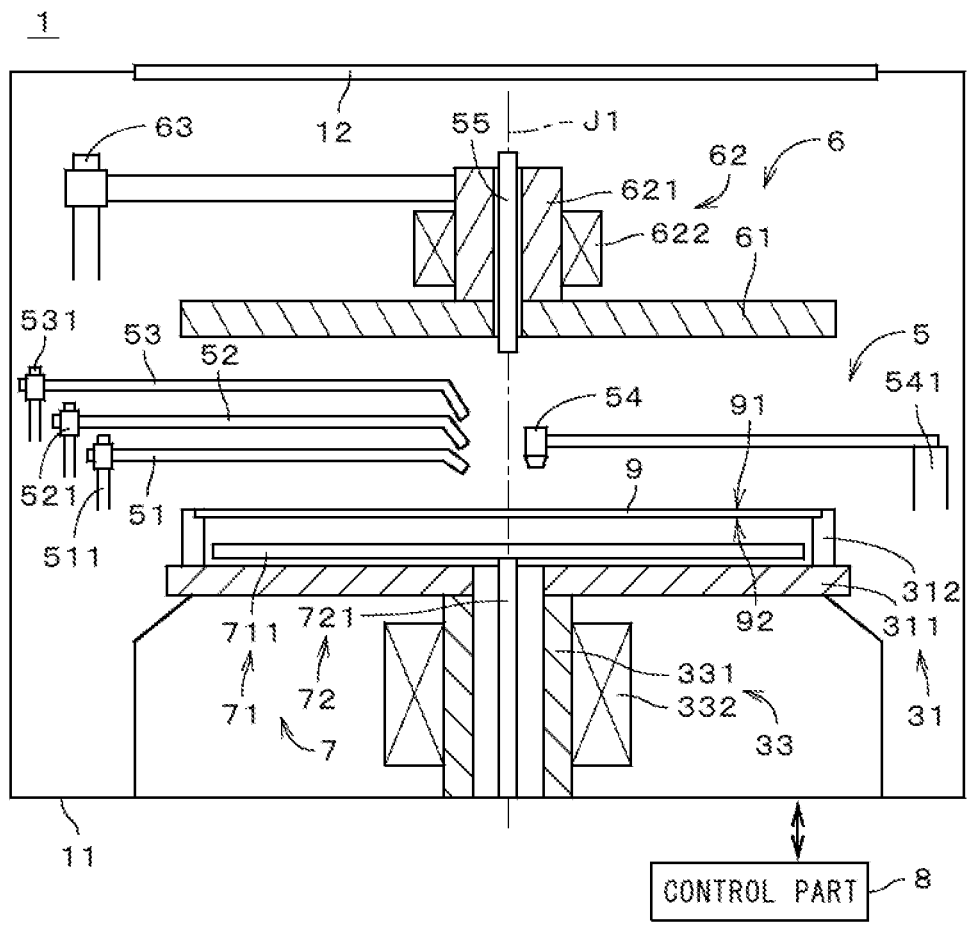
FIG. 2 is a side elevational view showing a configuration of a substrate processing apparatus.

FIG. 2 is a side elevational view showing a configuration of a substrate processing apparatus 1. The substrate processing apparatus 1 is a single-substrate processing apparatus for processing the substrate 9 one by one. The substrate processing apparatus 1 supplies a processing liquid onto the substrate 9 and thereby performs a liquid process. FIG. 2 shows part of the configuration of the substrate processing apparatus 1 in a cross section.

The substrate processing apparatus 1 includes a substrate holding part 31, a substrate rotating mechanism 33, a gas-liquid supply part 5, a shield part 6, a substrate heater 7, a control part 8, and a chamber 11. The substrate holding part 31, the substrate rotating mechanism 33, the shield part 6, the substrate heater 7, and the like are accommodated in an internal space of the chamber 11. Atop cover portion of the chamber 11 is provided with an airflow formation part 12 which supplies gas to the internal space and thereby forms an airflow flowing downward (i.e., downflow). As the airflow formation part 12, for example, used is an FFU (fan filter unit).

Figure 3:
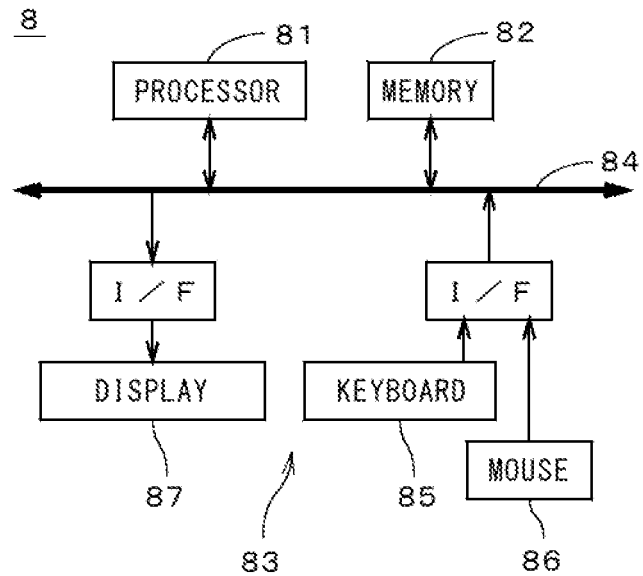
FIG. 3 is a view showing a constitution of a control part.

The control part 8 is disposed outside the chamber 11 and controls the substrate holding part 31, the substrate rotating mechanism 33, the gas-liquid supply part 5, the shield part 6, the substrate heater 7, and the like. As shown in FIG. 3, the control part 8 is an ordinary computer system including, for example, a processor 81, a memory 82, an input/output part 83, and a bus 84. The bus 84 is a signal circuit for connecting the processor 81, the memory 82, and the input/output part 83. The memory 82 stores therein a program and various information. The processor 81 executes various processings (e.g., numerical calculation) while using the memory 82 and the like in accordance with the program and the like stored in the memory 82. The input/output part 83 includes a keyboard 85 and a mouse 86 which receive an input from an operator, a display 87 which displays thereon an output or the like from the processor 81, a transmission part for transmitting the output or the like from the processor 81, and the like. Further, the control part 8 may be a programmable logic controller (PLC), a circuit board, or the like. The control part 8 may include a plurality of any constituent elements out of the computer system, the PLC, the circuit board, and the like.

The substrate holding part 31 and the substrate rotating mechanism 33 shown in FIG. 2 are each part of a spin chuck for holding and rotating the substrate 9. The substrate holding part 31 holds the substrate 9 in a horizontal state from below. The substrate holding part 31 is, for example, a mechanical chuck for mechanically supporting the substrate 9. The substrate holding part 31 includes a base part 311 and a plurality of chucks 312. The base part 311 is a substantially disk-like member around a central axis J1, facing toward the up-and-down direction. The substrate 9 is disposed above the base part 311, away from the base part 311. In other words, the base part 311 of the substrate holding part 31 is positioned at a position downwardly away from a lower main surface (hereinafter, also referred to as a "lower surface 92") of the substrate 9. The diameter of the base part 311 is slightly larger than that of the substrate 9.

The plurality of chucks 312 are arranged in a circumferential direction around the central axis J1 (hereinafter, also referred to simply as a "circumferential direction") at an outer peripheral portion of an upper surface of the base part 311. The plurality of chucks 312 are arranged, for example, at substantially regular angular intervals in the circumferential direction. In the substrate holding part 31, an outer edge portion of the substrate 9 is held by the plurality of chucks 312. Further, the substrate holding part 31 may be a chuck having any other structure.

The substrate rotating mechanism 33 is disposed below the substrate holding part 31. The substrate rotating mechanism 33 rotates the substrate 9 together with the substrate holding part 31 around the central axis J1. The substrate rotating mechanism 33 includes a shaft 331 and a motor 332. The shaft 331 is a substantially cylindrical member around the central axis J1. The shaft 331 extends in the up-and-down direction and is connected to a center portion of a lower surface of the base part 311 of the substrate holding part 31. The motor 332 is an electric rotary motor for rotating the shaft 331. Further, the substrate rotating mechanism 33 may be a motor (e.g., a hollow motor or the like) having any other structure.

The gas-liquid supply part 5 individually supplies a plurality of kinds of processing liquids onto the substrate 9 and performs a liquid process on the substrate 9. Further, the gas-liquid supply part 5 supplies an inert gas toward the substrate 9. The plurality of kinds of processing liquids include a chemical liquid, a rinse liquid, a replacement liquid, and a dry processing liquid described later.

The gas-liquid supply part 5 includes a first nozzle 51, a second nozzle 52, a third nozzle 53, and a fourth nozzle 54. The first nozzle 51, the second nozzle 52, the third nozzle 53, and the fourth nozzle 54 each eject different kinds of processing liquids toward an upper main surface (hereinafter, also referred to as an "upper surface 91") of the substrate 9 from above the substrate 9. On the upper surface 91 of the substrate 9, a fine pattern including a recessed portion is formed in advance. The pattern is, for example, a pattern having high aspect ratio. The first nozzle 51, the second nozzle 52, the third nozzle 53, and the fourth nozzle 54 are each formed of, for example, a resin having high chemical resistance, such as Teflon (registered trademark) or the like.

Further, in the gas-liquid supply part 5, two or more nozzles out of the first nozzle 51, the second nozzle 52, the third nozzle 53, and the fourth nozzle 54 may be gathered as one shared nozzle. In this case, the shared nozzle serves as each of the two or more nozzles. Inside the shared nozzle, an individual flow passage may be provided for each kind of processing liquid or a shared flow passage in which a plurality of kinds of processing liquids flow may be provided. Furthermore, each of the first nozzle 51, the second nozzle 52, the third nozzle 53, and the fourth nozzle 54 may consists of two or more nozzles.

The gas-liquid supply part 5 further includes a first nozzle moving mechanism 511, a second nozzle moving mechanism 521, a third nozzle moving mechanism 531, and a fourth nozzle moving mechanism 541. The first nozzle moving mechanism 511 moves the first nozzle 51 between a supply position above the substrate 9 and an escape position on an outer side from an outer edge of the substrate 9 in a radial direction around the central axis J1 (hereinafter, also referred to simply as a "radial direction") in a substantially horizontal direction. The second nozzle moving mechanism 521 moves the second nozzle 52 between the supply position above the substrate 9 and the escape position on an outer side from the outer edge of the substrate 9 in the radial direction in the substantially horizontal direction. The third nozzle moving mechanism 531 moves the third nozzle 53 between the supply position above the substrate 9 and the escape position on an outer side from the outer edge of the substrate 9 in the radial direction in the substantially horizontal direction. The fourth nozzle moving mechanism 541 moves the fourth nozzle 54 between the supply position above the substrate 9 and the escape position on an outer side from the outer edge of the substrate 9 in the radial direction in the substantially horizontal direction. The first nozzle moving mechanism 511 includes, for example, an electric linear motor, an air cylinder, or a ball screw and an electric rotary motor, which is connected to the first nozzle 51. The same applies to the second nozzle moving mechanism 521, the third nozzle moving mechanism 531, and the fourth nozzle moving mechanism 541.

The shield part 6 includes a top plate 61, a top plate rotating mechanism 62, and a top plate moving mechanism 63. The top plate 61 is a substantially disk-like member around the central axis J1 and is positioned above the substrate holding part 31. The diameter of the top plate 61 is slightly larger than that of the substrate 9. The top plate 61 is an opposed member which is opposed to the upper surface 91 of the substrate 9 and serves as a shield plate for shielding the space above the substrate 9.

The top plate rotating mechanism 62 is disposed above the top plate 61. The top plate rotating mechanism 62 rotates the top plate 61 around the central axis J1. The top plate rotating mechanism 62 includes a shaft 621 and a motor 622. The shaft 621 is a substantially cylindrical member around the central axis J1. The shaft 621 extends in the up-and-down direction and is connected to a center portion of an upper surface of the top plate 61. The motor 622 is an electric rotary motor for rotating the shaft 621. Further, the top plate rotating mechanism 62 may be a motor (e.g., a hollow motor or the like) having any other structure.

The top plate moving mechanism 63 moves the top plate 61 in the up-and-down direction above the substrate 9. The top plate moving mechanism 63 includes, for example, an electric linear motor, an air cylinder, or a ball screw and an electric rotary motor, which is connected to the shaft 621.

The gas-liquid supply part 5 further includes an upper nozzle 55. The upper nozzle 55 is disposed inside the shaft 621 of the top plate rotating mechanism 62. A lower end portion of the upper nozzle 55 protrudes downward from an opening formed at the center portion of the top plate 61, and faces a center portion of the upper surface 91 of the substrate 9 in the up-and-down direction. The upper nozzle 55 supplies an inert gas toward the upper surface 91 of the substrate 9.

The substrate heater 7 heats the substrate 9 from the side of the lower surface 92 thereof. In the exemplary case of FIG. 2, the substrate heater 7 includes a hot plate 71 and a hot plate moving mechanism 72. The hot plate 71 is a substantially disk-like member around the central axis J1 and is positioned below the substrate 9. Specifically, the hot plate 71 is disposed in the space between the lower surface 92 of the substrate 9 and the upper surface of the base part 311 of the substrate holding part 31. The diameter of the hot plate 71 slightly smaller than that of the substrate 9. The hot plate 71 directly faces the lower surface 92 of the substrate 9 in the up-and-down direction (in other words, without any member interposed therebetween). The hot plate 71 is an electric heater including a substantially disk-like plate body 711 and an electrically heated wire (not shown) buried inside the plate body 711. By supplying electric power to the electrically heated wire, the temperature of the plate body 711 formed of ceramics or the like is increased.

The hot plate moving mechanism 72 moves the hot plate 71 in the up-and-down direction below the substrate 9. The hot plate moving mechanism 72 includes a shaft 721 extending downward from a lower surface of the hot plate 71 and a driving part (not shown) connected to the shaft 721. The shaft 721 is disposed inside the shaft 331 of the substrate rotating mechanism 33. When the driving part moves the shaft 721 in the up-and-down direction, the hot plate 71 is moved in the up-and-down direction below the substrate 9. Further, The driving part of the hot plate moving mechanism 72 is, for example, an electric linear motor, an air cylinder, a ball screw and an electric rotary motor, or the like.

In the substrate heater 7, when the hot plate 71 having increased temperature is raised by the hot plate moving mechanism 72, to thereby come into contact with or get closer to the lower surface 92 of the substrate 9, the substrate 9 is heated from the side of the lower surface 92 thereof. When the hot plate 71 comes into contact with the lower surface 92 of the substrate 9, an almost entire upper surface of the plate body 711 comes into contact with the lower surface 92 of the substrate 9. In the exemplary case of FIG. 2, since no mechanism for rotating the hot plate 71 is provided, when the hot plate 71 comes into contact with the lower surface 92 of the substrate 9, the rotation of the substrate 9 and the substrate holding part 32 is stopped. Further, the hot plate 71 may be rotated, for example, together with the substrate holding part 32 by the substrate rotating mechanism 33.

Figure 4:
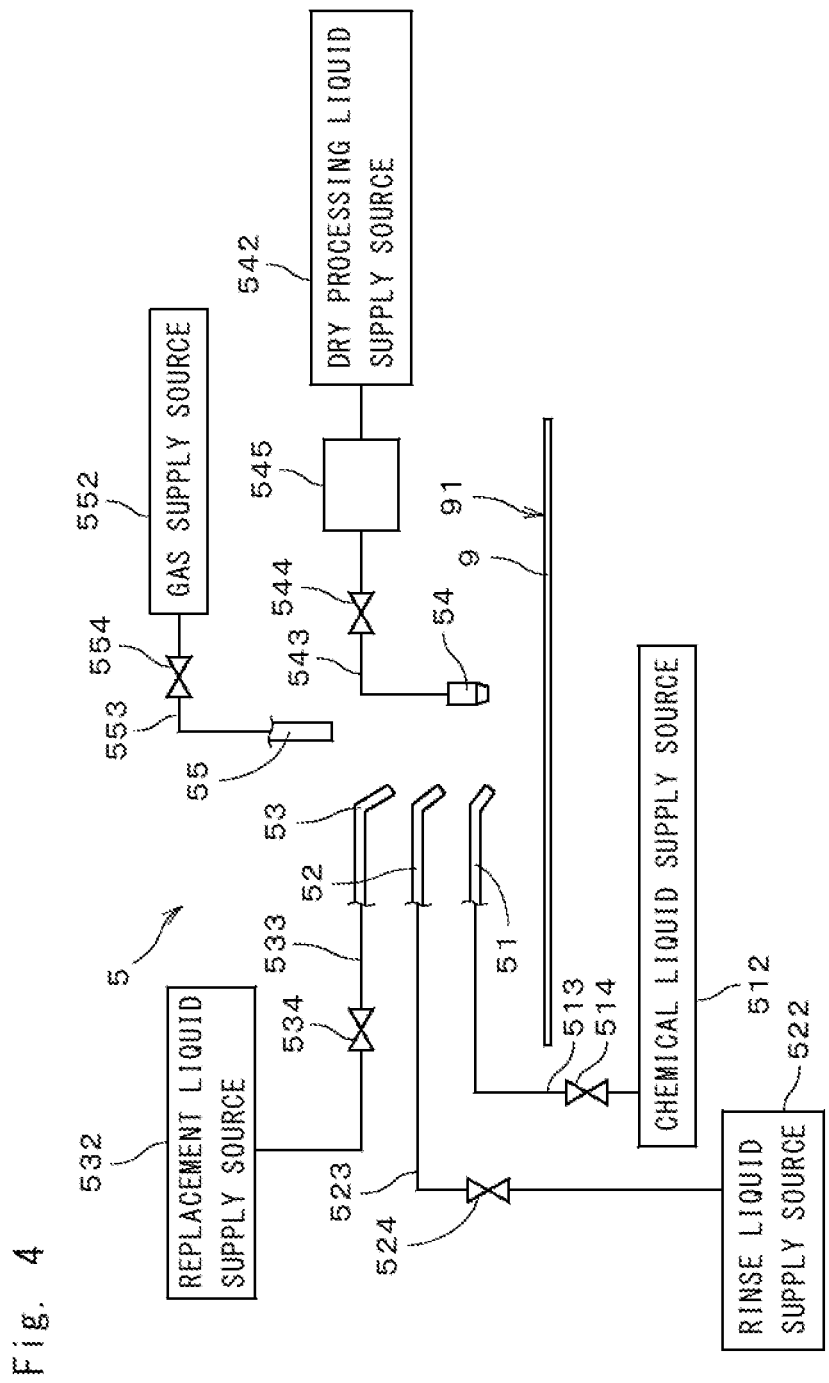
FIG. 4 is a block diagram showing a gas-liquid supply part.

FIG. 4 is a block diagram showing the gas-liquid supply part 5 of the substrate processing apparatus 1. The first nozzle 51 is connected to a chemical liquid supply source 512 through a pipe 513 and a valve 514. When the control part 8 (see FIG. 2) controls the valve 514 to open, a chemical liquid to be used in a chemical liquid process on the substrate 9 is ejected from a tip of the first nozzle 51 toward the upper surface 91 of the substrate 9. In other words, the first nozzle 51 serves as a chemical liquid supply part for supplying the chemical liquid onto the substrate 9. The chemical liquid is, for example, hydrofluoric acid. The chemical liquid may be a liquid other than hydrofluoric acid. The chemical liquid may be, for example, a liquid containing at least one of sulfuric acid, acetic acid, nitric acid, hydrochloric acid, hydrofluoric acid, aqueous ammonia, oxygenated water, organic acid (e.g., citric acid, oxalic acid, or the like), organic alkali (e.g., tetramethylammonium hydroxide (TMAH) or the like), a surface active agent (surfactant), and a corrosion inhibitor.

The second nozzle 52 is connected to a rinse liquid supply source 522 through a pipe 523 and a valve 524. When the control part 8 controls the valve 524 to open, a rinse liquid to be used in a rinsing process on the substrate 9 is ejected from a tip of the second nozzle 52 toward the upper surface 91 of the substrate 9. In other words, the second nozzle 52 serves as a rinse liquid supply part for supplying the rinse liquid onto the substrate 9. The rinse liquid is, for example, DIW (deionized water). The rinse liquid may be a liquid other than DIW. The rinse liquid may be, for example, any one of carbonated water, electrolytic ionized water, hydrogen water, ozone water, and a hydrochloric acid solution having a diluted concentration of about 10 ppm to 100 ppm.

The third nozzle 53 is connected to a replacement liquid supply source 532 through a pipe 533 and a valve 534. When the control part 8 controls the valve 534 to open, a replacement liquid to be used in a replacement process of the rinse liquid is ejected from a tip of the third nozzle 53 toward the upper surface 91 of the substrate 9. In other words, the third nozzle 53 serves as a replacement liquid supply part for supplying the replacement liquid onto the substrate 9. The replacement process is a process for supplying the replacement liquid onto the substrate 9 and replacing the rinse liquid on the substrate 9 with the replacement liquid. As the replacement liquid, used is a liquid having a relatively high affinity with the above-described rinse liquid and also having a relatively high affinity with a dry processing liquid described later. The replacement liquid is, for example, IPA (isopropyl alcohol). The replacement liquid may be a liquid other than IPA. The replacement liquid may be, for example, methanol, ethanol, or the like.

The fourth nozzle 54 is connected to a dry processing liquid supply source 542 through a pipe 543, a valve 544, and a liquid heater 545. The liquid heater 545 heats a dry processing liquid used for a drying process of the substrate 9 (specifically, given to the substrate 9 in order to perform the drying process of the substrate 9), as necessary in advance. The liquid heater 545 is, for example, an electric heater whose temperature is increased when electric power is supplied to an electrically heated wire incorporated therein. When the control part 8 controls the valve 544 to open, the dry processing liquid is ejected from a tip of the fourth nozzle 54 toward the upper surface 91 of the substrate 9. In other words, the fourth nozzle 54 serves as a dry processing liquid supply part for supplying the dry processing liquid onto the substrate 9, to be brought into contact therewith.

Preferably, the dry processing liquid contains fluorine-containing alcohol. The fluorine-containing alcohol is, for example, fluorine-containing alcohol having "—$CF_2H$ (difluoromethyl group)" or "—$CF_3$ (trifluoromethyl group)" at its terminus. The terminus refers to an end on a side opposite to "—OH (hydroxy group)" of the fluorinated alkyl chain in the molecule of fluorine-containing alcohol. Further, in a case where the fluorinated alkyl chain is branched, the terminus may be a terminus of a main chain or a terminus of a branched chain. The surface tension of the dry processing liquid is lower than that of the above-described rinse liquid. The boiling point of the dry processing liquid is higher than that of the rinse liquid. Further, the dry processing liquid is a liquid which causes no chemical reaction with the surface of the substrate 9 or the above-described pattern formed on the substrate 9. The number of Cs included in the molecular formula of fluorine-containing alcohol described above is preferably three or more, and more preferably four or more. Further, the number of Cs included in the molecular formula of fluorine-containing alcohol is preferably eight or less, and more preferably seven or less. When the number of Cs is made not larger than seven, it is possible to avoid becoming subject to the PFOA (perfluorooctanoic acid) regulation.

The dry processing liquid is, for example, a liquid (hereinafter, also referred to as a "first dry processing liquid") containing 1H,1H,7H-Dodecafluoroheptanol (rational formula: $H(CF_2)_6CH_2OH$) as fluorine-containing alcohol. Further, the dry processing liquid may be a liquid (hereinafter, also referred to as a "second dry processing liquid") containing 1H,1H,3H-Tetrafluoropropanol (rational formula: $CHF_2CF_2CH_2OH$) as fluorine-containing alcohol. Alternatively, the dry processing liquid may be a liquid (hereinafter, also referred to as a "third dry processing liquid") containing 2-(Perfluorohexyl)ethanol (rational formula: $F(CF_2)_6CH_2CH_2OH$) as fluorine-containing alcohol. The first dry processing liquid and the second dry processing liquid each contain fluorine-containing alcohol having —$CF_2H$ at its terminus. The third dry processing liquid contains fluorine-containing alcohol having —$CF_3$ at its terminus.

The above-described dry processing liquid may be a liquid other than the first dry processing liquid, the second dry processing liquid, or the third dry processing liquid. Further, the dry processing liquid may be one kind of liquid or may be a mixed solution containing two or more kinds of liquids. Preferably, the dry processing liquid contains at least one liquid selected out of a group consisting of the first dry processing liquid, the second dry processing liquid, and the third dry processing liquid.

In the present preferred embodiment, the first dry processing liquid is substantially formed of only 1H,1H,7H-Dodecafluoroheptanol. The second dry processing liquid is substantially formed of only 1H,1H,3H-Tetrafluoropropanol. The third dry processing liquid is substantially formed of only 2-(Perfluorohexyl)ethanol. The molecular weight of the first dry processing liquid is 332.1 (g/mol), the specific gravity (d20) thereof is 1.76 ($g/cm^3$), and the boiling point thereof is 169° C. to 170° C. The molecular weight of the second dry processing liquid is 132.1 (g/mol), the specific gravity (d20) thereof is 1.49 ($g/cm^3$), and the boiling point thereof is 109° C. to 110° C. The molecular weight of the third dry processing liquid is 364.1 (g/mol), the specific gravity (d20) thereof is 1.68 ($g/cm^3$), and the boiling point thereof is 190° C. to 200° C. The first dry processing liquid, the second dry processing liquid, and the third dry processing liquid can be each obtained from Daikin Industries, Ltd.

In the substrate processing apparatus 1, when the chemical liquid is supplied from the first nozzle 51 onto the substrate 9, the first nozzle 51 is positioned at the supply position and the second nozzle 52, the third nozzle 53, and the fourth nozzle 54 are positioned at the escape position. When the chemical liquid is supplied from the second nozzle 52 onto the substrate 9, the second nozzle 52 is positioned at the supply position and the first nozzle 51, the third nozzle 53, and the fourth nozzle 54 are positioned at the escape position. When the chemical liquid is supplied from the third nozzle 53 onto the substrate 9, the third nozzle 53 is positioned at the supply position and the first nozzle 51, the second nozzle 52, and the fourth nozzle 54 are positioned at the escape position. When the chemical liquid is supplied from the fourth nozzle 54 onto the substrate 9, the fourth nozzle 54 is positioned at the supply position and the first nozzle 51, the second nozzle 52, and the third nozzle 53 are positioned at the escape position.

The upper nozzle 55 is connected to a gas supply source 552 through a pipe 553 and a valve 554. When the control part 8 controls the valve 554 to open, an inert gas such as nitrogen ($N_2$) gas or the like is supplied from a tip of the upper nozzle 55 to the space between the upper surface 91 of the substrate 9 and a lower surface of the top plate 61 (see FIG. 2). The inert gas may be gas (e.g., argon (Ar) gas) other than nitrogen.

Next, an operation flow for processing the substrate 9 in the substrate processing apparatus 1 of FIG. 2 will be described with reference to FIG. 5. In the substrate processing apparatus 1, first, the substrate 9 having the upper surface 91 on which a fine pattern is formed in advance is held by the substrate holding part 31 in a horizontal state. Subsequently, the upper nozzle 55 starts supplying the inert gas (e.g., nitrogen gas). The flow rate of the inert gas to be supplied from the upper nozzle 55 is, for example, 10 l/min. Further, the substrate rotating mechanism 33 starts rotating the substrate 9. The rotation speed of the substrate 9 is, for example, 800 rpm to 1000 rpm. Furthermore, the top plate rotating mechanism 62 starts rotating the top plate 61. The rotation direction and the rotation speed of the top plate 61 are the same as, for example, those of the substrate 9. The position of the top plate 61 in the up-and-down direction is a position (hereinafter, also referred to as a "first processing position") at which the first nozzle 51 and the like can be arranged between itself and the substrate 9.

Then, in a state where the first nozzle 51 is positioned at the supply position, the chemical liquid (e.g., hydrofluoric acid) is supplied from the first nozzle 51 onto the center portion of the upper surface 91 of the substrate 9 (Step S11). The chemical liquid supplied onto the center portion of the substrate 9 is spread from the center portion of the substrate 9 outward in the radial direction by the centrifugal force due to the rotation of the substrate 9 and supplied entirely onto the upper surface 91 of the substrate 9. The chemical liquid spatters or flows out from the outer edge of the substrate 9 outward in the radial direction. The chemical liquid spattering or flowing out from the substrate 9 is received and collected by a not-shown cup part or the like. The same applies to the other processing liquids. In the substrate processing apparatus 1, by supplying the chemical liquid onto the substrate 9 for a predetermined time, the chemical liquid process of the substrate 9 is performed.

While the chemical liquid process of Step S11 is performed, as shown in FIG. 2, the hot plate 71 is positioned at a position largely away downward from the lower surface 92 of the substrate 9 and heating of the substrate 9 is not performed by the hot plate 71. Also while the rinsing process of Step S12 or the replacement process of Step S13 described below is performed, heating of the substrate 9 is not performed by the hot plate 71, like in Step S11.

After the chemical liquid process of the substrate 9 is finished, the first nozzle 51 which stops ejecting the chemical liquid is moved from the supply position to the escape position, and the second nozzle 52 is moved from the escape position to the supply position. Then, the rinse liquid (e.g., DIW) is supplied from the second nozzle 52 onto the center portion of the upper surface 91 of the substrate 9 (Step S12). The rotation speed of the substrate 9 during supply of the rinse liquid is, for example, 800 rpm to 1200 rpm. The rinse liquid supplied onto the center portion of the substrate 9 is spread from the center portion of the substrate 9 outward in the radial direction by the centrifugal force due to the rotation of the substrate 9 and supplied entirely onto the upper surface 91 of the substrate 9. The chemical liquid on the substrate 9 is moved by the rinse liquid outward in the radial direction and removed from the substrate 9. In the substrate processing apparatus 1, by supplying the rinse liquid onto the substrate 9 for a predetermined time, the rinsing process of the substrate 9 is performed.

After the chemical liquid is removed from the substrate 9 (in other words, all the chemical liquid on the substrate 9 is replaced with the rinse liquid), the rotation speed of the substrate 9 is reduced. A liquid film of the rinse liquid is thereby formed on the upper surface 91 of the substrate 9 and maintained. The rotation speed of the substrate 9 is, for example, 10 rpm. The liquid film of the rinse liquid entirely covers the upper surface 91 of the substrate 9. When the liquid film of the rinse liquid is formed, the second nozzle 52 stops ejecting the rinse liquid and is escaped from the supply position to the escape position. The rotation speed of the substrate 9 has only to be a rotation speed at which the upper surface 91 of the substrate 9 is not dried, and may be, for example, 10 rpm or higher.

Next, the third nozzle 53 is moved from the escape position to the supply position and the replacement liquid is supplied from the third nozzle 53 onto the center portion of the upper surface 91 of the substrate 9 (in other words, onto the center portion of the liquid film of the rinse liquid) (Step S13). The replacement liquid is, for example, IPA. The rotation speed of the substrate 9 during supply of the replacement liquid is, for example, 100 rpm to 300 rpm. The replacement liquid supplied on the center portion of the substrate 9 is spread from the center portion of the substrate 9 outward in the radial direction by the centrifugal force due to the rotation of the substrate 9 and supplied entirely onto the upper surface 91 of the substrate 9. The rinse liquid on the substrate 9 (in other words, the rinse liquid in contact with the upper surface 91 of the substrate 9) is moved by the replacement liquid outward in the radial direction and removed from the substrate 9. In the substrate processing apparatus 1, by supplying the replacement liquid onto the substrate 9 for a predetermined time, the process for replacing the rinse liquid with the replacement liquid on the substrate 9 is performed.

After the rinse liquid is removed from the substrate 9 (in other words, all the rinse liquid on the substrate 9 is replaced with the replacement liquid), the rotation speed of the substrate 9 is reduced. A liquid film of the replacement liquid is thereby formed on the upper surface 91 of the substrate 9 and maintained. The rotation speed of the substrate 9 is, for example, 10 rpm. The liquid film of the replacement liquid entirely covers the upper surface 91 of the substrate 9. When the liquid film of the replacement liquid is formed, the third nozzle 53 stops ejecting the replacement liquid and is escaped from the supply position to the escape position. The rotation speed of the substrate 9 has only to be a rotation speed at which the upper surface 91 of the substrate 9 is not dried, and may be, for example, 10 rpm or higher.

Next, the fourth nozzle 54 is moved from the escape position to the supply position and the dry processing liquid is supplied from the fourth nozzle 54 onto the center portion of the upper surface 91 of the substrate 9 (in other words, onto the center portion of the liquid film of the replacement liquid). The dry processing liquid is, for example, the first dry processing liquid or the second dry processing liquid described above. The rotation speed of the substrate 9 during supply of the dry processing liquid is, for example, 100 rpm to 300 rpm. The dry processing liquid supplied on the center portion of the substrate 9 is spread from the center portion of the substrate 9 outward in the radial direction by the centrifugal force due to the rotation of the substrate 9 and supplied entirely onto the upper surface 91 of the substrate 9. The replacement liquid on the substrate 9 (in other words, the replacement liquid in contact with the upper surface 91 of the substrate 9) is moved by the dry processing liquid outward in the radial direction and removed from the substrate 9. In the substrate processing apparatus 1, by supplying the dry processing liquid onto the substrate 9 for a predetermined time, all the replacement liquid on the substrate 9 is replaced with the dry processing liquid.

The dry processing liquid supplied from the fourth nozzle 54 onto the substrate 9 may be preheated by the above-described liquid heater 545 (see FIG. 4) or may not be preheated. Further, in a case where heating is performed by the liquid heater 545, the temperature of the dry processing liquid after heating by the liquid heater 545 is higher than a room temperature (e.g., 25° C.) and lower than the boiling point of the dry processing liquid.

After all the replacement liquid on the substrate 9 is replaced with the dry processing liquid, the rotation speed of the substrate 9 is reduced. A liquid film of the dry processing liquid is thereby formed on the upper surface 91 of the substrate 9 and maintained (Step S14). The liquid film of the dry processing liquid entirely covers the upper surface 91 of the substrate 9. When the liquid film of the dry processing liquid is formed, the fourth nozzle 54 stops ejecting the dry processing liquid and is escaped from the supply position to the escape position. Further, the rotation of the substrate holding part 32 and the substrate 9 by the substrate rotating mechanism 33 is stopped.

Next, the hot plate 71 is moved up from the position shown in FIG. 2 by the hot plate moving mechanism 72 and comes into contact with the lower surface 92 of the substrate 9. The hot plate 71 is preheated up to a predetermined temperature, and when the hot plate 71 comes into contact with the lower surface 92 of the substrate 9, the dry processing liquid in contact with the upper surface 91 of the substrate 9 is heated together with the substrate 9, and the temperature of the dry processing liquid is increased up to a predetermined contact temperature and maintained at the contact temperature (Step S15).

Further, in Step S15, the hot plate 71 may get closer to the lower surface 92 of the substrate 9 with a small gap interposed therebetween, instead of coming into contact with the lower surface 92. In this case, after the liquid film of the dry processing liquid is formed on the substrate 9, the rotation of the substrate 9 may not be stopped but may continue at low speed (e.g., 10 rpm). Further, in this case, heating of the substrate 9 from the side of the lower surface 92 by the hot plate 71 may be started concurrently with the supply of the dry processing liquid in Step S14.

In Step S15, as described above, the dry processing liquid to be supplied onto the substrate 9 may be heated in advance to be higher than the room temperature. In this case, it is possible to reduce the time required to increase the temperature of the dry processing liquid on the substrate 9 up to the contact temperature by heating using the hot plate 71.

The above-described contact temperature is not lower than the boiling point of the rinse liquid and lower than the boiling point of the dry processing liquid. Vaporization of the dry processing liquid on the substrate 9 is thereby suppressed, and even when some component of the rinse liquid (e.g., water) is mixed into the dry processing liquid, the component of the rinse liquid is vaporized and removed from the dry processing liquid. Further, when water is used as the rinse liquid, since the boiling point of the dry processing liquid is not lower than that of the rinse liquid, it is possible to prevent the moisture in the air from causing condensation and being mixed into the dry processing liquid. Preferably, the difference between the contact temperature and the boiling point of the dry processing liquid is 65° C. or less. In other words, it is preferable that the contact temperature should be lower than the boiling point of the dry processing liquid and not lower than the temperature which is lower than the boiling point of the dry processing liquid by 65° C.

In the substrate processing apparatus 1, the dry processing liquid at the contact temperature is in contact with the entire upper surface 91 of the substrate 9 for a predetermined contact time (preferably, 10 seconds or longer). The molecules of the dry processing liquid are thereby adsorbed on the upper surface 91 of the substrate 9 and the above-described pattern surface on the upper surface 91 of the substrate 9.

Figure 6A:
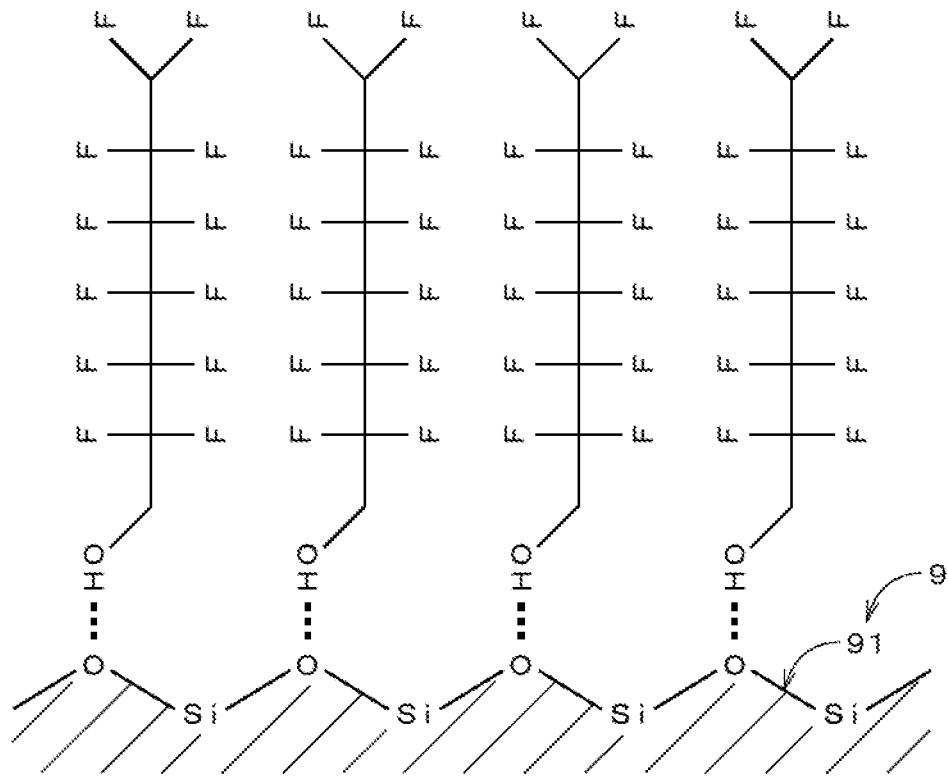
FIG. 6A is a view schematically showing molecules of a first dry processing liquid adsorbed on the substrate.
Figure 6B:
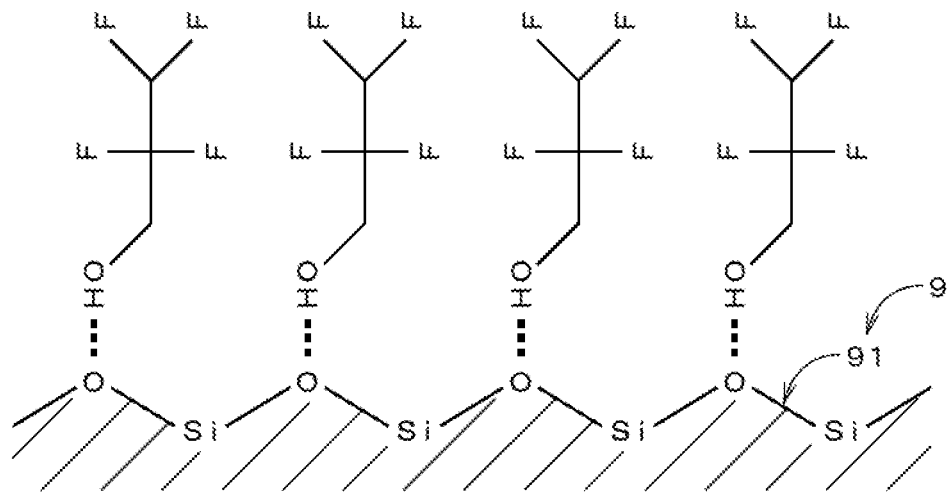
FIG. 6B is a view schematically showing molecules of a second dry processing liquid adsorbed on the substrate.
Figure 6C:
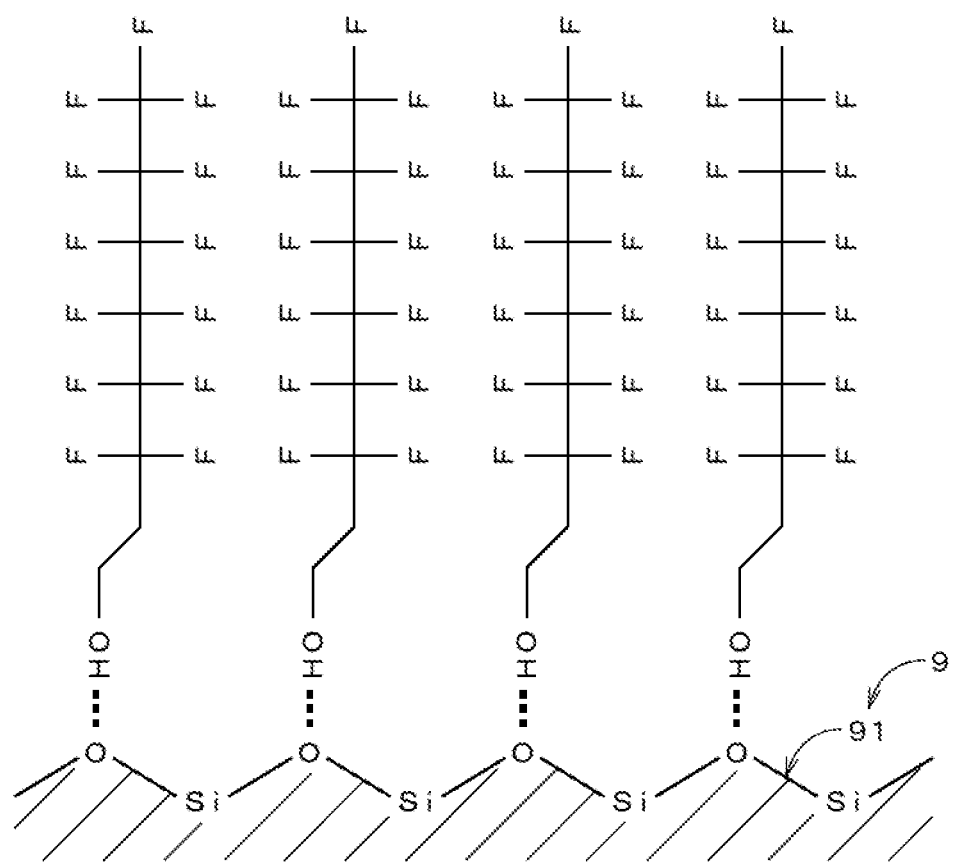
FIG. 6C is a view schematically showing molecules of a third dry processing liquid adsorbed on the substrate.

FIG. 6A is a view schematically showing molecules of the first dry processing liquid (i.e., 1H,1H,7H-Dodecafluoro-heptanol) adsorbed on the upper surface 91 of the substrate 9. FIG. 6B is a view schematically showing molecules of the second dry processing liquid (i.e., 1H,1H,3H-Tetrafluoropropanol) adsorbed on the upper surface 91 of the substrate 9. FIG. 6C is a view schematically showing molecules of the third dry processing liquid (i.e., 2-(Perfluorohexyl)ethanol) adsorbed on the upper surface 91 of the substrate 9. FIGS. 6A to 6C show the molecules of the first dry processing liquid, the second dry processing liquid, and the third dry processing liquid by using skeletal formulae, respectively.

As shown in FIG. 6A, the hydroxy group (—OH) of the first dry processing liquid and oxygen atom (O) on the upper surface 91 of the substrate 9 are attracted to each other and the molecules of the first dry processing liquid are thereby adsorbed on the upper surface 91 of the substrate 9. The upper surface 91 of the substrate 9 is thereby covered with the molecules of the first dry processing liquid. In detail, the upper surface 91 of the substrate 9 is covered with —$CF_2H$ which exists at the terminus of the molecule of the first dry processing liquid. Similarly, in the case of the second dry processing liquid shown in FIG. 6B, the molecules of the second dry processing liquid are adsorbed on the upper surface 91 of the substrate 9, and the upper surface 91 of the substrate 9 is thereby covered with —$CF_2H$ which exists at the terminus of the molecule of the second dry processing liquid. Almost similarly, in the case of the third dry processing liquid shown in FIG. 6C, the molecules of the third dry processing liquid are adsorbed on the upper surface 91 of the substrate 9, and the upper surface 91 of the substrate 9 is thereby covered with —$CF_3$ which exists at the terminus of the molecule of the third dry processing liquid. Further, since FIGS. 6A to 6C are schematic views, the adsorption direction and the adsorption density of the first dry processing liquid, the second dry processing liquid, and the third dry processing liquid with respect to the substrate 9 are different from actual ones.

Furthermore, similarly as to the pattern on the upper surface 91 of the substrate 9, the molecules of the first dry processing liquid are adsorbed on the pattern surface, and the pattern surface is thereby covered with —$CF_2H$ which exists at the terminus of the molecule of the first dry processing liquid. As compared with the case where the first dry processing liquid is not adsorbed on the pattern surface, the surface free energy of the pattern is thereby reduced, and the contact angle of the first dry processing liquid with respect to the pattern surface increases and gets closer to 90°. Similarly, in the case of the second dry processing liquid, the molecules of the second dry processing liquid are adsorbed on the pattern surface, and the pattern surface is thereby covered with —$CF_2H$ which exists at the terminus of the molecule of the second dry processing liquid. As compared with the case where the second dry processing liquid is not adsorbed on the pattern surface, the surface free energy of the pattern is thereby reduced, and the contact angle of the second dry processing liquid with respect to the pattern surface increases and gets closer to 90°. Almost similarly, in the case of the third dry processing liquid, the molecules of the third dry processing liquid are adsorbed on the pattern surface, and the pattern surface is thereby covered with —$CF_3$ which exists at the terminus of the molecule of the third dry processing liquid. As compared with the case where the third dry processing liquid is not adsorbed on the pattern surface, the surface free energy of the pattern is thereby reduced, and the contact angle of the third dry processing liquid with respect to the pattern surface increases and gets closer to 90°. Even in a case where any one of the first dry processing liquid, the second dry processing liquid, and the third dry processing liquid is adsorbed on the pattern surface, the surface free energy of the pattern on which the dry processing liquid is adsorbed becomes lower than the surface free energy of silicon (Si) on which no dry processing liquid is adsorbed.

In the pattern surface, as the fluorinated alkyl chain of the molecule of fluorine-containing alcohol becomes longer, the adsorption direction of the molecules of the dry processing liquid becomes more perpendicular to the pattern surface and the orientation of the molecules of the dry processing liquid on the pattern surface becomes higher. The number of Cs included in the molecule of the first dry processing liquid shown in FIG. 6A is seven and the number of Cs included in the molecule of the second dry processing liquid shown in FIG. 6B is three. Thus, since the fluorinated alkyl chain of the molecule of the first dry processing liquid is longer than that of the molecule of the second dry processing liquid, the adsorption direction of the molecules of the first dry processing liquid becomes much more perpendicular than that of the molecules of the second dry processing liquid. Therefore, the molecules of the first dry processing liquid are adsorbed on the pattern surface more densely than those of the second dry processing liquid. As a result, in the case where the first dry processing liquid is used as the dry processing liquid, the amount of reduction in the surface free energy becomes larger and the contact angle with respect to the pattern surface becomes closer to 90°, as compared with the case where the second dry processing liquid is used.

When the above-described contact time elapses after the dry processing liquid at the contact temperature is brought into contact with the entire upper surface 91 of the substrate 9, the top plate 61 goes down from the first processing position and gets positioned at a position (hereinafter, also referred to as a "second processing position") which is still closer to the upper surface 91 of the substrate 9. The space between the upper surface 91 of the substrate 9 and the lower surface of the top plate 61 is thereby substantially shielded from the surrounding space (i.e., the space outside the substrate 9 in the radial direction).

Further, the hot plate 71 slightly goes down to be separated from the lower surface 92 of the substrate 9 and is close to the lower surface 92 with a small gap interposed therebetween. Even in this state, almost like in the state where the hot plate 71 is in contact with the lower surface 92 of the substrate 9, the temperature of the liquid film of the dry processing liquid is maintained at the above-described contact temperature. Further, as described above, in the case where the hot plate 71 is rotated together with the substrate holding part 32, the hot plate 71 may be maintained in the state of being in contact with the lower surface 92 of the substrate 9.

Then, when the inert gas is ejected from the upper nozzle 55 toward the center portion of the upper surface 91 of the substrate 9, a hole (i.e., an area in which the dry processing liquid is repelled and the upper surface 91 of the substrate 9 is exposed) is formed at the center portion of the liquid film of the dry processing liquid. The hole is spread out outward in the circumferential direction by the inert gas supplied from the upper nozzle 55. In other words, the liquid film of the dry processing liquid on the substrate 9 (in other words, the dry processing liquid in contact with the upper surface 91 of the substrate 9) is moved outward in the radial direction by the inert gas and removed from the substrate 9.

Further, in the substrate processing apparatus 1, the substrate 9 is rotated at high speed by the substrate rotating mechanism 33. The dry processing liquid existing on the upper surface 91 of the substrate 9 is thereby moved outward in the radial direction by the centrifugal force and quickly removed from the substrate 9. In the substrate processing apparatus 1, when the high-speed rotation of the substrate 9 by the substrate rotating mechanism 33 continues for a predetermined time, the drying process (so-called spin-dry process) of the substrate 9 is performed (Step S16). In the above-described exemplary case, the upper nozzle 55 and the substrate rotating mechanism 33 serves as a dry processing liquid removing part for removing the dry processing liquid in a liquid state from the upper surface 91 of the substrate 9 and also serves as a dry processing part for drying the substrate 9 by removing the dry processing liquid.

Further, in Step S16, the dry processing liquid on the substrate 9 may be removed only by the ejection of the inert gas from the upper nozzle 55 without any rotation of the substrate 9 performed by the substrate rotating mechanism 33. Alternatively, in Step S16, the dry processing liquid on the substrate 9 may be removed only by the rotation of the substrate 9 by the substrate rotating mechanism 33 without any ejection of the inert gas from the upper nozzle 55.

In the drying process of the substrate 9, in a state where a liquid surface of the dry processing liquid goes down to be positioned between the patterns, a capillary force for pulling the pattern in a horizontal direction is exerted. The capillary force σmax is expressed in Eq. (1) by using the surface tension γ of the dry processing liquid, the contact angle θ between the dry processing liquid and the pattern, the distance D between the patterns, the height H of the pattern, and the width W of the pattern.

$$\sigma max = (6\gamma \cdot \cos \theta / D) \cdot (H/W)^2 \qquad \text{Eq. (1)}$$

In the substrate processing apparatus 1, as described above, the surface tension γ of the dry processing liquid is lower than the surface tension of the rinse liquid. Therefore, in the drying process of Step S16, the capillary force σmax exerted on the pattern can be reduced, as compared with the case where the substrate 9 is dried (hereinafter, also referred to as a "rinse-dry process") by performing the spin-dry process or the like to thereby remove the rinse liquid (e.g., DIW) remaining on the substrate 9 after the rinsing process. As a result, in the drying process of Step S16, it is possible to suppress the collapse of the pattern more than in the rinse-dry process.

Further, in the substrate processing apparatus 1, the surface free energy of the pattern is reduced by adsorbing fluorine-containing alcohol contained in the dry processing liquid on the surface of the pattern. For this reason, the contact angle θ with respect to the pattern surface can be increased and made closer to 90°, as compared with the case (hereinafter, also referred to as a "replacement-dry process") where the substrate 9 is dried by replacing the rinse liquid remaining on the substrate 9 after the rinsing process with the replacement liquid (e.g., IPA) and removing the replacement liquid by the spin-dry process or the like. Therefore, in the drying process of Step S16, the capillary force σmax exerted on the pattern can be reduced, as compared with the replacement-dry process. As a result, in the drying process of Step S16, the collapse of the pattern can be suppressed more than in the replacement-dry process.

Further, in the conventional replacement-dry process, as the replacement liquid, used is IPA, methanol, ethanol, or the like. Since IPA, methanol, and ethanol can be adsorbed on the pattern surface by —OH but do not each contain fluorine, these do not each contribute to reduction in the surface free energy of the pattern. Therefore, there is a limitation in suppressing the collapse of the pattern during the drying process.

Further, if HFE (hydrofluoroether), HFC (hydrofluorocarbon), or HFO (hydrofluoroolefin) is used, instead of the dry processing liquid used in Step S14, since the molecule of each of these liquids has no functional group such as —OH, which is easy to be adsorbed on the pattern surface, at its end, any one of these liquids is not substantially adsorbed on the pattern surface. Therefore, the surface free energy of the pattern is not substantially reduced. For this reason, it is not possible to suitably suppress the collapse of the pattern during the drying process.

Figure 7:
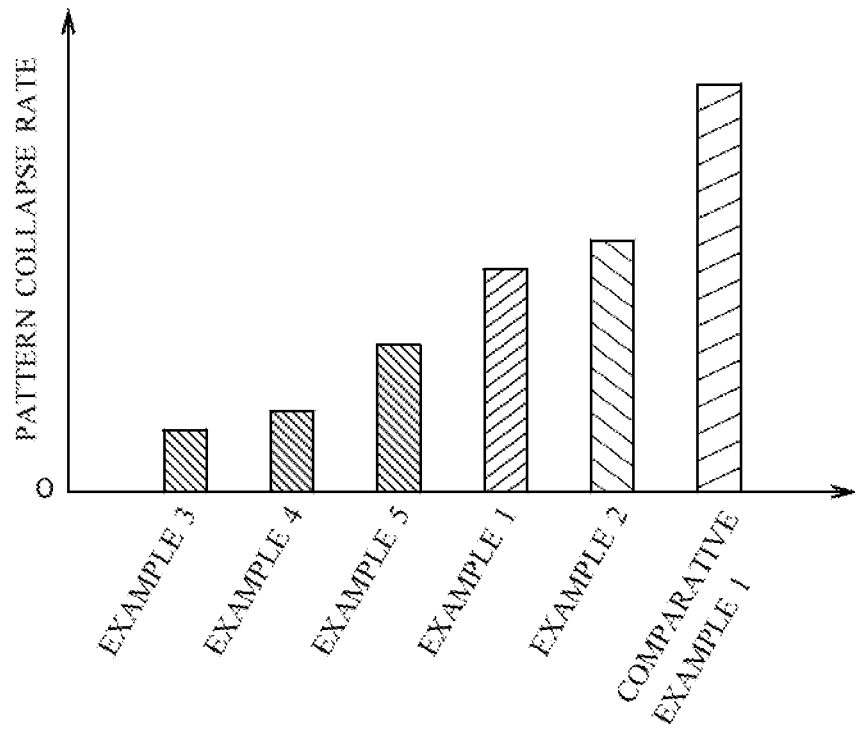
FIG. 7 is a graph showing the collapse rate of a pattern.
Figure 8:
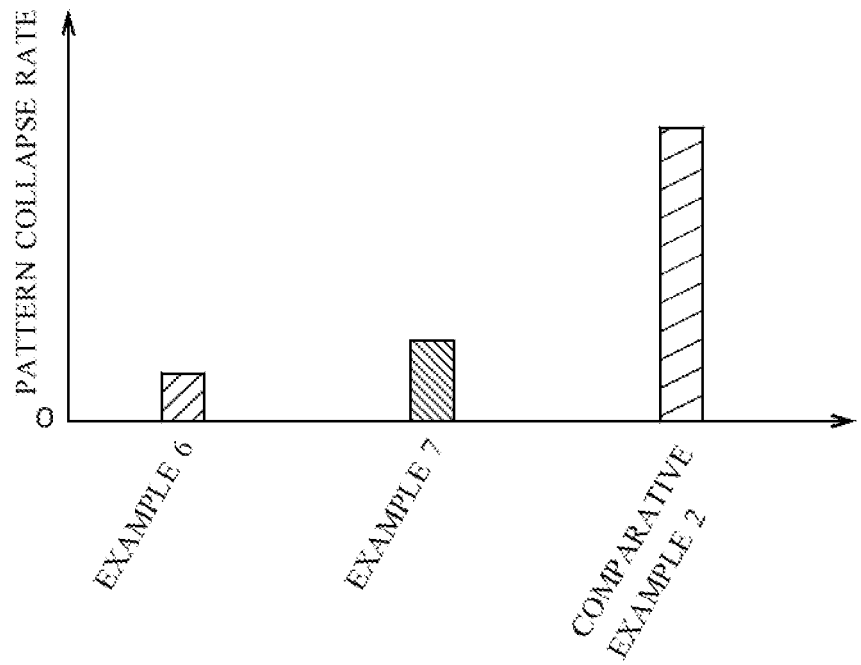
FIG. 8 is a graph showing the collapse rate of the pattern.

FIGS. 7 and 8 are graphs showing comparison results through experiments of the collapse rate of the pattern on the substrate 9 after the processes in above-described Steps S11 to S16 and the collapse rate of the pattern on the substrate 9 after the above-described replacement-dry process (i.e., the process for removing the replacement liquid on the substrate 9 by the spin-dry process and drying the substrate 9 after Steps S11 to S13 are performed and Steps S14 and S15 are omitted), respectively. In FIGS. 7 and 8, the experiments are performed by using test coupons each having a surface on which a pattern is formed. FIG. 7 shows the results of experiments performed by using test coupons each having a hydrophilic surface on which a $SiO_2$ film is formed by natural oxidation. FIG. 8 shows the results of experiments performed by using test coupons each having a hydrophobic surface on which an etching process is performed on the $SiO_2$ film.

The vertical axis in FIGS. 7 and 8 represents the collapse rate of the pattern on the test coupon surface. "Examples 1 and 6" on the horizontal axis in FIGS. 7 and 8 each represent the experimental result corresponding to the above-described processes of Steps S11 to S16 using the first dry processing liquid as the dry processing liquid. "Example 2" on the horizontal axis in FIGS. 7 and 8 represents the experimental result corresponding to the above-described processes of Steps S11 to S16 using the second dry processing liquid as the dry processing liquid. "Examples 3 to 5 and 7" on the horizontal axis in FIGS. 7 and 8 each represent the experimental result corresponding to the above-described processes of Steps S11 to S16 using the third dry processing liquid as the dry processing liquid. Further, "Comparative Example 1" on the horizontal axis represents the experimental result corresponding to the replacement-dry process (i.e., the process in which Steps S14 and S15 are omitted) using the IPA as the replacement liquid. "Comparative Example 2" on the horizontal axis represents the experimental result corresponding to the above-described processes of Steps S11 to S16 in the case where HFE-7100 (rational formula: $C_4F_9OCH_3$, methoxynonafluorobutane) which is one kind of HFE is used, instead of the dry processing liquid, in the processes of Steps S14 and S15.

The test coupon is a substantially rectangular flat plate-like member of 20 mm square. The pattern formed on the surface of the test coupon consists of a plurality of rectangles having the center at the same position and different sizes in a plan view. The AR (aspect ratio: the ratio between a bottom width and a height of a pattern) of the pattern is 20. The supply of the processing liquid in Steps S11 to S14 is performed by immersing the test coupon in a beaker in which each processing liquid is stored.

In Example 1 shown in FIG. 7, the test coupon is immersed in the first dry processing liquid at the contact temperature in the beaker for one minute and then the test coupon is taken out from the beaker and air-dried. The contact temperature is a temperature lower than the boiling point of the first dry processing liquid by 10° C. After that, the collapse rate of the pattern on the test coupon is obtained. As to the substrate 9 having the hydrophilic surface, the pattern collapse rate in Example 1 is about 47%. The pattern collapse rate is obtained by performing image analysis of the test coupon. Also in Examples 2 to 7 and Comparative Examples 1 and 2, the same method of obtaining the pattern collapse rate is used.

Further, as to Example 1, as a result of obtaining the pattern collapse rate while changing the contact temperature of the first dry processing liquid in various manners within a range lower than the boiling point of the first dry processing liquid, the collapse rate increases as the difference between the contact temperature and boiling point becomes larger. Further, as to Example 1, as a result of measuring the contact angle of the first dry processing liquid with respect to the test coupon while changing the above-described contact time in various manners, the contact angle becomes larger as the contact time becomes longer within a range not longer than 15 minutes but the contact angle does not significantly change when the contact time becomes not shorter than 15 minutes.

Example 2 in FIG. 7 is the same as Example 1 except that the first dry processing liquid is changed to the second dry processing liquid and the contact temperature is a temperature lower than the boiling point of the second dry processing liquid by 10° C. As to the substrate 9 having the hydrophilic surface, the pattern collapse rate in Example 2 is about 53%.

Example 3 in FIG. 7 is the same as Example 1 except that the first dry processing liquid is changed to the third dry processing liquid and the contact temperature is a temperature lower than the boiling point of the third dry processing liquid by 40° C. As to the substrate 9 having the hydrophilic surface, the pattern collapse rate in Example 3 is about 13%.

Example 4 in FIG. 7 is the same as Example 1 except that the first dry processing liquid is changed to the third dry processing liquid and the contact temperature is a temperature lower than the boiling point of the third dry processing liquid by 65° C. As to the substrate 9 having the hydrophilic surface, the pattern collapse rate in Example 4 is about 17%.

Example 5 in FIG. 7 is the same as Example 1 except that the first dry processing liquid is changed to the third dry processing liquid and the contact temperature is a temperature lower than the boiling point of the third dry processing liquid by 90° C. As to the substrate 9 having the hydrophilic surface, the pattern collapse rate in Example 5 is about 31%.

Comparative Example 1 in FIG. 7 is the same as Example 1 except that the first dry processing liquid is changed to IPA and the contact temperature is a temperature lower than the boiling point of IPA by 10° C. As to the substrate 9 having the hydrophilic surface, the pattern collapse rate in Comparative Example 1 is about 86%.

As shown in FIG. 7, as to the substrate 9 having the hydrophilic surface, by performing the above-described processes of Steps S11 to S16 (Examples 1 to 5), it is possible to suppress the collapse of the pattern as compared with the case of performing the replacement-dry process (Comparative Example 1) in which Steps S14 and S15 are omitted. In other words, even on the substrate 9 having the hydrophilic surface whose pattern collapse rate is higher than that of the hydrophobic surface in the conventional drying process (Comparative Example 1), by performing the processes of Steps S11 to S16 (Examples 1 to 5) in accordance with the present invention, it is possible to suppress the collapse of the pattern.

In comparison between Example 1 and Example 2, by using the first dry processing liquid (Example 1) in which the number of Cs included in the molecular formula is seven, among the first dry processing liquid and the second dry processing liquid each having —$CF_2H$ at the terminus, it is possible to further suppress the collapse of the pattern as compared with the case of using the second dry processing liquid (Example 2) in which the number of Cs included in the molecular formula is three. Further, in comparison between Example 1 and Examples 3 to 5, by using the third dry processing liquid (Examples 3 to 5) having —$CF_3$ at the terminus, it is possible to further suppress the collapse of the pattern as compared with the case of using the first dry processing liquid (Example 1) having —$CF_2H$ at the terminus. In comparison between Examples 3 and 4 and Example 5, by making the difference between the contact temperature and the boiling point of the third dry processing liquid not larger than 65° C. (Examples 3 and 4), it is possible to further suppress the collapse of the pattern as compared with the case where the difference between the contact temperature and the boiling point of the third dry processing liquid is larger than 65° C. (Example 5: the temperature difference is 90° C.).

In Example 6 shown in FIG. 8, by using the beaker, the test coupon is immersed in dilute hydrofluoric acid (DHF) (concentration: about 1 volume %) for one minute, subsequently immersed in DIW for one minute, further immersed in IPA for three minutes, and then immersed in the first dry processing liquid at the room temperature. Then, the temperature of the first dry processing liquid is increased up to the contact temperature which is lower than the boiling point of the first dry processing liquid by 10° C. and maintained for one minute. After that, the test coupon is taken out from the beaker and air-dried, and the collapse rate of the pattern is obtained. As to the substrate 9 having the hydrophobic surface, the pattern collapse rate in Example 6 is about 10%.

Example 7 in FIG. 8 is the same as Example 6 except that the first dry processing liquid is changed to the third dry processing liquid and the contact temperature is a temperature lower than the boiling point of the third dry processing liquid by 40° C. As to the substrate 9 having the hydrophobic surface, the pattern collapse rate in Example 7 is about 17%.

Comparative Example 2 in FIG. 8 is the same as Example 6 except that the first dry processing liquid is changed to HFE-7100 and the contact temperature is a temperature lower than the boiling point of HFE-7100 by 10° C. As to the substrate 9 having the hydrophobic surface, the pattern collapse rate in Comparative Example 2 is about 62%.

As shown in FIG. 8, as to the substrate 9 having the hydrophobic surface, by using the dry processing liquid to perform the above-described processes of Steps S11 to S16 (Examples 6 and 7), it is possible to suppress the collapse of the pattern as compared with the case of using HFE to perform Steps S11 to S16 (Comparative Example 2). Further, in comparison between Example 6 and Example 7, by using the first dry processing liquid (Example 6) having —$CF_2H$ at the terminus, it is possible to further suppress the collapse of the pattern as compared with the case of using the third dry processing liquid (Example 7) having —$CF_3$ at the terminus.

The following Table 1 shows a relation between the contact temperature of the dry processing liquid in Step S15 (in other words, the heating temperature of the dry processing liquid by the hot plate 71) and the collapse rate of the pattern on the substrate 9 after the drying process of Step S16.

TABLE 1

|  | Heating Temperature | Collapse Rate |
|---|---|---|
| Example 8 | 150° C. | 6.8% |
| Example 9 | 170° C. | 1.7% |

In Examples 8 and 9 shown in Table 1, the experiments are performed by using test coupons each having the hydrophilic surface on which a pattern different from that on the above-described test coupon is formed. The pattern of the test coupon consists of a large number of fine columnar patterns (i.e., pinholder-like Si nano pillars). The test coupon is a substantially rectangular flat plate-like member of 20 mm square. The AR (aspect ratio: the ratio between a bottom width and a height of a pattern) of the pattern formed on the surface of the test coupon is 20. The supply of the processing liquid in Steps S11 to S14 is performed by dropping the processing liquid onto the upper surface of the test coupon (i.e., the surface on which the above-described pattern is formed) by using a pipette. Further, the removal of the processing liquid from the test coupon is performed by using the pipette to suck the processing liquid on the test coupon.

In Example 8, the third dry processing liquid at the room temperature is dropped onto the upper surface of the test coupon placed on the hot plate (Step S14), and the test coupon is heated by the hot plate up to 150° C. from the side of the lower surface (in other words, the surface on which no pattern is formed) (Step S15). The temperature (i.e., the contact temperature) of the test coupon in Step S15 is lower than the boiling point (190° C. to 200° C.) of the third dry processing liquid. Then, after the test coupon supplied with the third dry processing liquid is maintained at 150° C. for one minute, the third dry processing liquid is removed from the test coupon, and the collapse rate of the pattern on the test coupon is obtained. The pattern collapse rate is obtained by performing image analysis of the test coupon, like in the above-described case. The pattern collapse rate in Example 8 is 6.8%.

Example 9 is the same as Example 8 except that the contact temperature in Step S15 is 170° C. The pattern collapse rate in Example 9 is about 1.7%. In comparison between Example 8 and Example 9, as the difference between the contact temperature and the boiling point of the dry processing liquid becomes smaller, the collapse rate is reduced.

After above-described Step S16 (the drying process of the substrate 9) is finished, by using the substrate heater 7 to heat the substrate 9, the molecules of the dry processing liquid adsorbed on the surface of the substrate 9 (i.e., the surface of the pattern on the substrate 9, or the like) are removed (Step S17). In an adsorbed-molecule removal process of Step S17, the temperature of the substrate 9 (hereinafter, also referred to as a "molecule removal temperature") is a temperature higher than the boiling point of the above-described dry processing liquid. The molecules of the dry processing liquid to be removed from the substrate 9 in Step S17 are not those of the dry processing liquid in a liquid state but are a small amount of molecules remaining on the substrate 9, being adsorbed thereon, even after the dry processing liquid in a liquid state is removed from the substrate 9 in the drying process of Step S16. After Step S17 is finished, the substrate 9 is unloaded from the substrate processing apparatus 1.

In the above-described exemplary case, the adsorbed-molecule removal process of Step S17 is performed on the substrate 9 held by the substrate holding part 31 in the same chamber 11 as used in Steps S11 to S16, but this is only one exemplary case. For example, the substrate 9 after Step S16 is finished is transferred from the processing unit 108 serving as the substrate processing apparatus 1 to the other processing unit 108 (see FIG. 1), and in the other processing unit 108, the adsorbed-molecule removal process of the substrate 9 may be performed by performing an ashing process using plasma, UV, excimer, or the like. Alternatively, in the other processing unit 108, the adsorbed-molecule removal process may be performed by heating with the hot plate.

In the above-described exemplary case, though the replacement process of the rinse liquid with the replacement liquid in Step S13 is performed between the rinsing process in Step S12 and the supply of the dry processing liquid in Step S14, in a case where the dry processing liquid is directly supplied onto the liquid film of the rinse liquid on the substrate 9 and the rinse liquid can be thereby suitably removed from the substrate 9, Step S13 may be omitted. In a case, for example, where the affinity between the rinse liquid and the dry processing liquid is high to some degree, Step S13 can be omitted. Further, also in a case, for example, where the specific gravity of the dry processing liquid is larger than that of the rinse liquid to some degree or more and the dry processing liquid suitably moves toward the bottom of the liquid film of the rinse liquid by supplying the dry processing liquid at low flow rate onto the liquid film of the rinse liquid, Step S13 can be omitted.

As described above, the substrate processing method for processing the substrate 9 having an upper surface on which a pattern including a recessed portion is formed includes a step of supplying a chemical liquid onto the upper surface 91 of the substrate 9 (Step S11), a step of supplying a rinse liquid onto the upper surface 91 of the substrate 9 after Step S11 (Step S12), a step of supplying a dry processing liquid onto the upper surface 91 of the substrate 9, to thereby form a liquid film of the dry processing liquid on the upper surface 91 of the substrate 9 after Step S12 (Step S14), a step of heating the substrate 9 from the side of the lower surface 92 thereof in a state where the liquid film of the dry processing liquid is formed on the upper surface 91 thereof (Step S15), and a step of drying the substrate 9 by removing the liquid film of the dry processing liquid from the upper surface 91 of the substrate 9 after Step S15 (Step S16). The surface tension of the dry processing liquid is lower than that of the rinse liquid. The boiling point of the dry processing liquid is higher than that of the rinse liquid. The heating temperature of the substrate 9 in Step S15 is not lower than the boiling point of the rinse liquid and lower than that of the dry processing liquid. It is thereby possible to suppress collapse of the pattern during the drying process of Step S16.

The above-described substrate processing method has advantages described below, as compared with other heating methods, since the liquid film of the dry processing liquid is heated from the side of the lower surface 92 of the substrate 9 in Step S15. In a case, for example, where the dry processing liquid which is preheated up to a temperature higher than the above-described contact temperature is supplied onto the substrate 9 and the liquid film temperature of the dry processing liquid on the substrate 9 is controlled to become the contact temperature by a temperature decrease due to a contact with the substrate 9 and the outside air, since it is difficult to accurately estimate the temperature decrease, there is a possibility that the control of the heating temperature of the dry processing liquid may become complicated. Further, since it is necessary that the temperature of the dry processing liquid should be lower than the boiling point in the preheating of the dry processing liquid, there is a limitation in reducing the difference between the boiling point of the dry processing liquid and the liquid film temperature of the dry processing liquid on the substrate 9. Furthermore, in order to maintain the liquid film temperature on the substrate 9, it is necessary to continue the supply of the dry processing liquid also after the formation of the liquid film, and there is a possibility that the cost for the processing of the substrate 9 may increase.

In contrast to this, in the above-described substrate processing method, by heating the liquid film of the dry processing liquid from the side of the lower surface 92 of the substrate 9, it is possible to easily cause the temperature of a contact portion in an interface between the dry processing liquid on the substrate 9 and the substrate 9 to become a desired temperature. Further, since the difference between the boiling point of the dry processing liquid and the liquid film temperature of the dry processing liquid on the substrate 9 can be made smaller, as shown in Examples 8 and 9, it is possible to still further suppress the collapse of the pattern during the drying process in Step S16. Furthermore, since the supply of the dry processing liquid can be stopped after formation of the liquid film of the dry processing liquid on the substrate 9, it is also possible to suppress the cost for the processing of the substrate 9.

Further, in a case where light is emitted to the liquid film of the dry processing liquid from above the substrate 9 to thereby heat the liquid film, the light is reflected on the liquid film surface of the dry processing liquid, and there is a possibility that the heating efficiency of the liquid film may be reduced.

In contrast to this, in the above-described substrate processing method, since the temperature of a portion of the liquid film of the dry processing liquid, which is in contact with the upper surface 91 of the substrate 9, can be made not lower than a surface temperature of the liquid film of the dry processing liquid, it is possible to suppress occurrence of crack or the like due to quick vaporization of the liquid film surface. Further, it is also possible to perform the heating of the liquid film of the dry processing liquid with high efficiency.

As described above, it is preferable that the dry processing liquid should contain fluorine-containing alcohol. In Steps S14 to S15, as described above, —OH of the dry processing liquid is thereby coupled with oxygen atom (O) or the like of the pattern surface and the molecules of the dry processing liquid are adsorbed on the pattern surface. For this reason, the pattern surface is covered with the molecules of the dry processing liquid. Therefore, the surface free energy of the pattern is reduced and the contact angle of the dry processing liquid with respect to the pattern surface increases to get closer to 90°, as compared with the case where the dry processing liquid is not adsorbed on the pattern surface. As a result, since the capillary force exerted between the patterns is reduced, it is possible to further suppress the collapse of the pattern during the drying process of Step S16.

It is preferable that the above-described fluorine-containing alcohol should have —CF$_2$H at the terminus. The pattern surface is thereby covered with —CF$_2$H existing at the terminus of the molecule of the dry processing liquid. This —CF$_2$H at the terminus of the molecule has a large effect of reducing the surface free energy. Therefore, it is possible to still further suppress the collapse of the pattern during the drying process of Step S16.

Further, it is also preferable that fluorine-containing alcohol should have —CF$_3$ at the terminus. The pattern surface is thereby covered with —CF$_3$ existing at the terminus of the molecule of the dry processing liquid. This —CF$_3$ at the terminus of the molecule has a large effect of reducing the surface free energy, almost like —CF$_2$H. Therefore, it is possible to much further suppress the collapse of the pattern during the drying process of Step S16.

As described above, it is preferable that the number of Cs included in the molecular formula of fluorine-containing alcohol should be four or more. As shown also in the experimental result of FIG. 7, since the number of Cs is four or more (Example 1), it is possible to still further suppress the collapse of the pattern, as compared with the case where the number of Cs is lower than four (Example 2).

Preferably, the above-described substrate processing method further includes a step of removing molecules of the dry processing liquid adsorbed on the upper surface 91 of the substrate 9 by heating the substrate 9 after Step S16 (Step S17). Thus, by removing unnecessary adsorbates on the upper surface 91 of the substrate 9, it is possible to improve the cleanability of the substrate 9.

Preferably, the above-described substrate processing method further includes a step of supplying the replacement liquid onto the upper surface 91 of the substrate 9, to thereby replace the rinse liquid on the upper surface 91 of the substrate 9 with the replacement liquid between Step S12 (supply of the rinse liquid) and Step S14 (supply of the dry processing liquid) (Step S13). In this case, in Step S14, the replacement liquid on the upper surface 91 of the substrate 9 is replaced with the dry processing liquid. Since it is thereby possible to avoid direct contact between the rinse liquid and the dry processing liquid on the substrate 9, even when the affinity between the rinse liquid and the dry processing liquid is relatively low, it is possible to smoothly change the processing liquid in contact with the upper surface 91 of the substrate 9 from the rinse liquid to the dry processing liquid while preventing liquid splash or the like due to the direct contact therebetween.

As described above, preferably, in Step S14, the preheated dry processing liquid is supplied onto the upper surface 91 of the substrate 9. It is thereby possible to reduce the time taken from the start of supplying the dry processing liquid to the contact between the substrate 9 and the dry processing liquid at the contact temperature, as compared with the case where the dry processing liquid at the room temperature is supplied onto the upper surface 91 of the substrate 9 and then heated up to the contact temperature, or the like case. As a result, it is possible to reduce the time required for the processing of the substrate 9.

As described above, preferably, also during Step S16 (removal of the liquid film of the dry processing liquid), the substrate 9 is heated from the side of the lower surface 92. Since it is thereby possible to suppress reduction in the surface tension of the dry processing liquid also during Step S16, it is possible to further suppress the collapse of the pattern. In terms of collapse suppression of the pattern, it is preferable that the heating temperature of the substrate 9 during Step S16 should be almost the same as that in Step S15.

As described above, it is preferable that heating of the substrate 9 in Step S15 should be performed by the electric heater which is so disposed as to face the lower surface 92 of the substrate 9. It is thereby possible to heat the substrate 9 with a simple configuration. Further, as described above, it is preferable that the hot plate 71 should be used as the electric heater, which can heat the substrate 9 by coming into contact with or getting closer to the lower surface 92 of the substrate 9. More preferably, the size of the hot plate 71 should be almost the same as that of the substrate 9. It is thereby possible to improve the inplane uniformity of the liquid film temperature of the dry processing liquid on the upper surface 91 of the substrate 9. In other words, it is possible to reduce the difference in the temperature of the liquid film depending on the difference in the position on the upper surface 91 of the substrate 9. As a result, it is also possible to improve the inplane uniformity in the adsorption of the molecules of the dry processing liquid upon the pattern surface on the substrate 9. Therefore, in the entire upper surface 91 of the substrate 9, it is possible to suppress the collapse of the pattern almost uniformly.

In the above-described substrate processing method, it is preferable that the difference between the above-described contact temperature and the boiling point of the dry processing liquid should be not larger than 65° C. (e.g., Examples 3 and 4 in FIG. 7). It is thereby possible to adsorb the molecules of the dry processing liquid on the pattern with high efficiency. As a result, it is possible to still further suppress the collapse of the pattern, as compared with the case where the difference between the contact temperature and the boiling point of the dry processing liquid is larger than 65° C. (Example 5).

As described above, in Step S15, it is preferable that the contact time of the dry processing liquid at the contact temperature with the upper surface 91 of the substrate 9 should be not shorter than ten seconds. The adsorption of the molecules of the dry processing liquid upon the pattern surface on the substrate 9 is thereby suitably performed. As a result, it is possible to further suppress the collapse of the pattern during the drying process of Step S16.

The above-described substrate processing apparatus 1 includes a chemical liquid supply part (the first nozzle 51 in the above-described exemplary case) supplying a chemical liquid onto the upper surface 91 of the substrate 9, a rinse liquid supply part (the second nozzle 52 in the above-described exemplary case) supplying a rinse liquid onto the upper surface 91 of the substrate 9, a dry processing liquid supply part (the fourth nozzle 54 in the above-described exemplary case) supplying a dry processing liquid onto the upper surface 91 of the substrate 9, the substrate heater 7 heating the substrate 9 from the side of the lower surface 92 thereof in a state where a liquid film of the dry processing liquid is formed on the upper surface 91 thereof, and a dry processing part (the upper nozzle 55 and/or the substrate rotating mechanism 33 in the above-described exemplary case) drying the substrate 9 by removing the liquid film of the dry processing liquid from the upper surface 91 of the substrate 9. The surface tension of the dry processing liquid is lower than that of the rinse liquid. The boiling point of the dry processing liquid is higher than that of the rinse liquid. The temperature of heating of the substrate 9 performed by the substrate heater 7 is not lower than the boiling point of the rinse liquid and lower than that of the dry processing liquid. The chemical liquid supply part, the rinse liquid supply part, the dry processing liquid supply part, the substrate heater 7 and the dry processing part may each have a structure different from the above example.

It is thereby possible to suppress the collapse of the pattern during the drying process, as described above. Further, it is possible to reduce the difference between the boiling point of the dry processing liquid and the liquid film temperature of the dry processing liquid on the substrate 9 while suppressing occurrence of crack or the like in the liquid film of the dry processing liquid.

In the above-described substrate processing apparatus 1, it is preferable that the substrate heater 7 should be an electric heater which is so disposed as to face the lower surface 92 of the substrate 9. It is thereby possible to simplify the configuration of the substrate processing apparatus 1. Further, as described above, it is preferable that the hot plate 71 should be used as the electric heater, which can heat the substrate 9 by coming into contact with or getting closer to the lower surface 92 of the substrate 9. More preferably, the size of the hot plate 71 should be almost the same as that of the substrate 9. It is thereby possible to improve the inplane uniformity of the liquid film temperature of the dry processing liquid on the upper surface 91 of the substrate 9 and also improve the inplane uniformity in the adsorption of the molecules of the dry processing liquid upon the pattern surface on the substrate 9. Therefore, in the entire upper surface 91 of the substrate 9, it is possible to suppress the collapse of the pattern almost uniformly.

As described above, it is preferable that the dry processing liquid should contain fluorine-containing alcohol. It is thereby possible to suppress the collapse of the pattern during the drying process of the substrate 9, like in the above-described case.

In the substrate processing apparatus 1 and the substrate processing method described above, various modifications can be made.

For example, the dry processing liquid is not limited to the above-described first dry processing liquid or second dry processing liquid, but may be a dry processing liquid containing any other kind of fluorine-containing alcohol which has —$CF_2H$ at the terminus. Alternatively, as described above, the dry processing liquid may be a dry processing liquid containing any one of various kinds of fluorine-containing alcohol which has —$CF_3$ at the terminus. Further, the dry processing liquid may be a dry processing liquid containing any one of various kinds of fluorine-containing alcohol which has any structure other than —$CF_2H$ or —$CF_3$ at the terminus. The number of Cs included in the molecular formula of the fluorine-containing alcohol may be not larger than three or may be not smaller than eight. Furthermore, the dry processing liquid may be a dry processing liquid containing no fluorine-containing alcohol.

The heating of substrate 9 from the side of the lower surface 92 thereof in Step S15 does not necessarily need to be performed by the hot plate 71 but may be performed by any one of various methods. There may be a case, for example, where a light emitting part disposed below the substrate 9 is provided in the substrate heater 7, and by emitting light to the lower surface 92 of the substrate 9 from the light emitting part, the substrate 9 is heated from the side of the lower surface 92 thereof. Alternatively, there may be another case where a nozzle disposed below the substrate 9 is provided in the substrate heater 7, and by supplying a fluid such as heated inert gas or the like from the nozzle onto the lower surface 92 of the substrate 9, the substrate 9 is heated from the side of the lower surface 92 thereof.

In Step S15, the contact time of the dry processing liquid at the contact temperature with the upper surface 91 of the substrate 9 may be shorter than ten seconds. Further, the difference between the contact temperature and the boiling point of the dry processing liquid may be larger than 65° C.

In the substrate processing apparatus 1, in the drying process of Step S16, removal of the dry processing liquid from the substrate 9 may be performed by any one of various methods. For example, there may be the following case. By using the hot plate 71 to heat the substrate 9 up to a temperature not lower than the boiling point of the dry processing liquid, a portion of the dry processing liquid on the substrate 9, which is in contact with the substrate 9, is vaporized, to thereby form a gas layer. Then, after a hole is opened in the liquid film of the dry processing liquid by ejecting nitrogen gas or the like onto a center portion of the liquid film of the dry processing liquid which is supported on the gas layer, the hole is extended outward in the radial direction by further ejection of nitrogen gas and rotation of the substrate 9, to thereby remove the dry processing liquid in a liquid state from the substrate 9. Alternatively, there may be another case where by using a suction mechanism whose suction port is disposed in the vicinity of the outer peripheral edge of the substrate 9, the dry processing liquid on the upper surface 91 of the substrate 9 is sucked and thereby removed.

In the substrate processing apparatus 1, during the drying process of Step S16, heating of the dry processing liquid on the substrate 9 does not necessarily need to be performed by the substrate heater 7. For example, heating of the liquid film of the dry processing liquid during Step S16 may be performed by emission of light to the liquid film. Alternatively, heating of the liquid film of the dry processing liquid during Step S16 may be performed by supplying a fluid such as heated inert gas or the like onto the lower surface 92 of the substrate 9. Further, in Step S16, the liquid film of the dry processing liquid does not necessarily need to be heated, but heating of the liquid film may be omitted.

After Step S16 is finished, the adsorbed-molecule removal process of Step S17 may be omitted in a case where the molecules of the dry processing liquid adsorbed on the pattern surface have almost no ill effect on the quality of the substrate 9, or the like case.

Steps S11 to S17 described above may be performed in an apparatus having a configuration other than that of the substrate processing apparatus 1.

The above-described substrate processing apparatus 1 may be used for processing a glass substrate, other than the semiconductor substrate, which is used in a flat panel display such as a liquid crystal display, an organic EL (Electroluminescence) display, or the like, or a glass substrate used in any other display device. Further, the above-described substrate processing apparatus 1 may be used for processing a substrate for optical disk, a substrate for magnetic disk, a substrate for magneto-optic disk, a substrate for photomask, a ceramic substrate, a substrate for solar battery, and the like.

The configurations in the above-discussed preferred embodiment and variations may be combined as appropriate only if those do not conflict with one another.

While the invention has been shown and described in detail, the foregoing description is in all aspects illustrative and not restrictive. It is therefore understood that numerous modifications and variations can be devised without departing from the scope of the invention.

REFERENCE SIGNS LIST

1 Substrate processing apparatus
7 Substrate heater
9 Substrate
33 Substrate rotating mechanism
51 First nozzle
52 Second nozzle
53 Third nozzle
54 Fourth nozzle
55 Upper nozzle
71 Hot plate
91 Upper surface (of substrate)
92 Lower surface (of substrate)
S11 to S17 Step

The invention claimed is:

1. A substrate processing method for processing a substrate having an upper surface on which a pattern including a recessed portion is formed, comprising:
  a) supplying a chemical liquid onto an upper surface of a substrate;
  b) supplying a rinse liquid onto said upper surface of said substrate after said operation a);
  c) supplying a replacement liquid onto said upper surface of said substrate, to thereby replace said rinse liquid on said upper surface of said substrate with said replacement liquid after said operation b);
  d) supplying a dry processing liquid onto said upper surface of said substrate, to thereby replace said replacement liquid on said upper surface of said substrate with said dry processing liquid and form a liquid film of said dry processing liquid on said upper surface of said substrate after said operation c);
  e) heating said substrate from the side of a lower surface thereof in a state where said liquid film of said dry processing liquid is formed on said upper surface thereof; and
  f) drying said substrate by removing said liquid film of said dry processing liquid from said upper surface of said substrate after said operation e),
  wherein the boiling point of said replacement liquid is lower than that of said rinse liquid,
  the surface tension of said dry processing liquid is lower than that of said rinse liquid,
  said dry processing liquid contains fluorine-containing alcohol,
  the boiling point of said fluorine-containing alcohol is higher than that of said rinse liquid, and
  the heating temperature of said substrate in said operation e) is not lower than said boiling point of said rinse liquid and lower than that of said dry processing liquid.

2. The substrate processing method according to claim 1, further comprising:
  removing molecules of said dry processing liquid adsorbed on said upper surface of said substrate by heating said substrate after said operation f).

3. The substrate processing method according to claim 1, wherein
  said dry processing liquid which is preheated is supplied onto said upper surface of said substrate in said operation d).

4. The substrate processing method according to claim 1, wherein
  said substrate is heated from the side of said lower surface thereof also during execution of said operation f).

5. The substrate processing method according to claim 1, wherein
  heating of said substrate in said operation e) is performed by an electric heater which is so disposed as to face said lower surface of said substrate.

6. The substrate processing method according to claim 1, wherein said replacement liquid is isopropyl alcohol, methanol or ethanol.

7. The substrate processing method according to claim 1, wherein the number of Cs included in the molecular formula of said fluorine-containing alcohol is three or more, and eight or less.

8. The substrate processing method according to claim 7, wherein said dry processing liquid contains at least one liquid selected out of a group consisting of 1H,1H,7H-Dodecafluoroheptanol, 1H,1H,3H-Tetrafluoropropanol, and 2-(Perfluorohexyl) ethanol.

9. A substrate processing method for processing a substrate having an upper surface on which a pattern including a recessed portion is formed, comprising:
   a) supplying a chemical liquid onto an upper surface of a substrate;
   b) supplying a rinse liquid onto said upper surface of said substrate after said operation a);
   c) supplying a replacement liquid onto said upper surface of said substrate, to thereby replace said rinse liquid on said upper surface of said substrate with said replacement liquid after said operation b);
   d) supplying a dry processing liquid onto said upper surface of said substrate, to thereby replace said replacement liquid on said upper surface of said substrate with said dry processing liquid and form a liquid film of said dry processing liquid on said upper surface of said substrate after said operation c);
   e) heating said substrate from the side of a lower surface thereof in a state where said liquid film of said dry processing liquid is formed on said upper surface thereof; and
   f) drying said substrate by removing said liquid film of said dry processing liquid from said upper surface of said substrate after said operation e),
   wherein the surface tension of said dry processing liquid is lower than that of said rinse liquid; and
   g) removing molecules of said dry processing liquid adsorbed on said upper surface of said substrate by heating said substrate after said operation f),
   the boiling point of said replacement liquid is lower than that of said rinse liquid,
   the boiling point of said dry processing liquid is higher than that of said rinse liquid, and
   the heating temperature of said substrate in said operation e) is not lower than said boiling point of said rinse liquid and lower than that of said dry processing liquid and,
   in said operation g), the temperature of said substrate is higher than the boiling point of said dry processing liquid.

10. The substrate processing method according to claim 9, wherein said replacement liquid is isopropyl alcohol, methanol or ethanol.

11. The substrate processing method according to claim 9, wherein said dry processing liquid which is preheated is supplied onto said upper surface of said substrate in said operation d).

12. The substrate processing method according to claim 9, wherein said substrate is heated from the side of said lower surface thereof also during execution of said operation f).

13. The substrate processing method according to claim 9, wherein heating of said substrate in said operation e) is performed by an electric heater which is so disposed as to face said lower surface of said substrate.

* * * * *